United States Patent [19]
Saito et al.

[11] Patent Number: 5,510,631
[45] Date of Patent: Apr. 23, 1996

[54] NON-MONOCRYSTALLINE SILICON CARBIDE SEMICONDUCTOR AND SEMICONDUCTOR DEVICE EMPLOYING THE SAME

[75] Inventors: Keishi Saito; Tatsuyuki Aoike; Toshimitsu Kariya; Yuzo Koda, all of Nagahama, Japan

[73] Assignee: Canon Kabushiki Kaisha, Tokyo, Japan

[21] Appl. No.: 289,258

[22] Filed: Aug. 11, 1994

Related U.S. Application Data

[62] Division of Ser. No. 840,537, Feb. 25, 1992, Pat. No. 5,362,684.

[30] Foreign Application Priority Data

Feb. 25, 1991 [JP] Japan ........................ 3-50133

[51] Int. Cl.$^6$ ............... H01L 31/0312; H01L 29/76; H01L 31/06; H01L 21/205
[52] U.S. Cl. ............... 257/77; 257/66; 257/76; 257/443; 257/463; 437/100
[58] Field of Search ............... 257/76, 77, 56, 257/58, 62, 65, 72, 75, 66, 57, 463, 443, 431

[56] References Cited

U.S. PATENT DOCUMENTS

| | | | |
|---|---|---|---|
| 4,217,374 | 8/1980 | Ovshinsky et al. | 427/39 |
| 4,465,750 | 8/1984 | Ogawa et al. | 257/77 |
| 4,769,682 | 9/1988 | Yang et al. | 257/76 |
| 5,298,767 | 3/1994 | Shor et al. | 257/77 |

FOREIGN PATENT DOCUMENTS 61-5579  1/1986  Japan ........................ 257/77

OTHER PUBLICATIONS

Mahan et al., "Small Angle X–Ray Scattering from Microvoids in the a–SiC:H Alloy," IEEE Transactions on Electron Devices, vol. 36, No. 12, Dec. 1989, pp. 2859–2862.

Primary Examiner—Mahshid Saadat
Attorney, Agent, or Firm—Fitzpatrick, Cella, Harper & Scinto

[57] ABSTRACT

A non-monocrystalline silicon carbide semiconductor comprises carbon atoms, silicon atoms, and at least one of hydrogen atoms and halogen atoms, the non-monocrystalline silicon carbide semiconductor having therein microvoids with an average radius of not more than 3.5 Å at a microvoid density of not more than $1\times10^{19}$ cm$^{-3}$.

14 Claims, 6 Drawing Sheets

NON-MONOCRYSTALLINE SILICON CARBIDE SEMICONDUCTOR AND SEMICONDUCTOR DEVICE EMPLOYING THE SAME

This application is a division of application Ser. No. 07/840,537 filed Feb. 25, 1992, now U.S. Pat. No. 5,362,684, issued Nov. 8, 1994.

BACKGROUND OF THE INVENTION

1. Field of the Invention

The present invention relates to a non-monocrystalline silicon carbide semiconductor such as an amorphous silicon carbide semiconductor, (naturally including microcrystalline silicon carbide semiconductors), a polycrystalline silicon carbide semiconductor, and the like. The present invention also relates to a process for producing the semiconductor, and a semiconductor device employing the semiconductor.

2. Related Background Art

Silicon semiconductor films such as amorphous silicon semiconductor films and polycrystalline silicon semiconductor films are practically used for photoelectric transducing elements and semiconductor elements such as electrophotographic light-receiving members, solar cells, thin film transistors, and photosensors. In particular, solar cells are desired to to be improved further in the quality of the film in order to prevent photodegradation and to raise the transducing efficiency, and so forth.

Recently, amorphous silicon semiconductors used in usual solar cells, thin film transistors, and the like are reported to contain, in the amorphous silicon semiconductor film thereof, microvoids of 4 to 5 Å in an average radius in a density of $2\times10^{19}$ (cm$^{-3}$).

Non-monocrystalline silicon carbide semiconductors are attracting attention for use as the material of a solar cell window. The non-monocrystalline silicon carbide semiconductors are also reported to have microvoids therein having an average radius of from 4 to 6 Å in a density of not less than $5\times10^{19}$ cm$^{-3}$ (A. H. Mahan, D. L. Williamson, B. P. Nelson, and R. S. Crandall: "Characterization of microvoids in device quality, hydrogenated amorphous silicon by small-angle X-ray scattering and infrared measurements", Physical Review B, Vol. 40, No. 17, 15, Dec. 1989-1, 12024; and A. H. Mahan, B. P. Nelson, and D. L. Williamson: "Small angle X-ray scattering from microvoids in the a-SiC:H alloy", IEEE Transactions on Electron Devices, Vol. 36, No. 12, Dec. 1989, 2859)

The above-mentioned papers suggest that the microvoids relate to the state of the band end and the recombination centers, and further that hydrogen atoms are bonded in the microvoids, and the hydrogen atoms can migrate within the voids, which participates in photodegradation.

The inventors of the present invention have found that the microvoids in conventional non-monocrystalline silicon carbide semiconductors are in a shape of a circle or an ellipsoid having a depth of 2 to 5 atoms by observation with STM (scanning tunneling microscopy). Some stresses are assumed to be caused around the microvoids in consideration of arrangement of the atoms in the vicinity thereof. Thus, in conventional non-monocrystalline silicon carbide, a large number of carbon atoms and silicon atoms are considered to be displaced from the normal crystalline bonds.

Such displacement of the atoms of carbon and silicon disadvantageously prevents activation of doped impurities, and lowers the doping efficiency, and further causes trapping of the impurities in the microvoids to form bonding of the impurity in an inactive state. Further, presence of such microvoids and the distortion due to microvoids disadvantageously lowers the mobility of the charges.

SUMMARY OF THE INVENTION

An object of the present invention is to provide a non-monocrystalline silicon carbide semiconductor having microvoids of a smaller average radius in a lower density of the microvoids.

Another object of the present invention is to provide a non-monocrystalline silicon carbide semiconductor which exhibits high doping efficiency of an impurity.

Still another object of the present invention is to provide a non-monocrystalline silicon carbide semiconductor which exhibits highly close contact in lamination of a plurality of semiconductor layers.

A further object of the present invention is to provide a non-monocrystalline silicon carbide semiconductor which is capable of forming a junction that has excellent characteristics.

A still another object of the present invention is to provide a non-monocrystalline silicon carbide semiconductor which may be used satisfactorily in a thin film form.

A-still further object of the present invention is to provide a non-monocrystalline silicon carbide semiconductor which allows the electric charge to migrate readily therein.

A still further object of the present invention is to provide a process suitable for producing the above-mentioned non-monocrystalline silicon carbide semiconductor.

According to an aspect of the present invention, there is provided a non-monocrystalline silicon carbide semiconductor comprising carbon atoms, silicon atoms, and at least one of hydrogen atoms and halogen atoms, the non-monocrystalline silicon carbide semiconductor having therein microvoids with an average radius of not more than 3.5 Å at a microvoid density of not more than $1\times10^{19}$ (cm$^{-3}$).

According to another aspect of the present invention, there is provided a semiconductor device comprising the above-mentioned non-monocrystalline silicon carbide semiconductor.

According to a further aspect of the present invention, there is provided a process for producing the above-mentioned non-monocrystalline silicon carbide semiconductor, the process comprising adding deuterium gas to a starting silane type gas and a starting silicon carbide type gas and effecting microwave glow discharge decomposition.

DESCRIPTION OF THE PREFERRED EMBODIMENT

Figure 1:
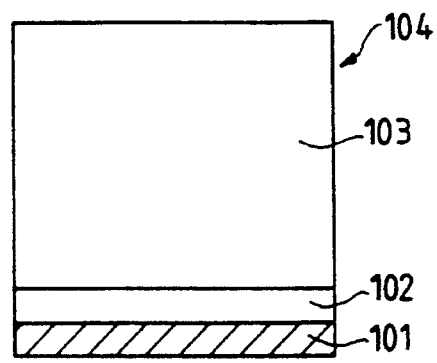
FIG. 1 illustrates schematically a layer constitution of a light-receiving member for electrophotography employing the non-monocrystalline silicon carbide semiconductor of the present invention.

The preferred embodiment of the non-monocrystalline silicon carbide semiconductor of the present invention contains at least carbon atoms, silicon atoms, and hydrogen atoms and/or halogen atoms, the non-monocrystalline silicon carbide semiconductor having therein microvoids with an average radius of not more than 3.5 Å at a microvoid density of not more than $1 \times 10^{19}$ (cm$^{-3}$).

The preferred embodiment of the process of the present invention produces a non-monocrystalline silicon carbide semiconductor having therein microvoids with an average radius of not more than 3.5 Å at a microvoid density of not more than $1 \times 10^{19}$ (cm$^{-3}$), the process comprising adding deuterium gas to a starting silane type gas and a starting silicon carbide type gas and subjecting the gases to microwave glow discharge decomposition.

With the average radius of not more than 3.5 Å of the microvoids in the present invention, the possibility increases that the hydrogen atoms contained in the microvoids form three-centered bonding of C—H—C, which enables the compensation of the dangling bonds of the carbon atoms and structural relaxation with less content of hydrogen.

With the microvoid density of $1 \times 10^{19}$ (cm$^{-3}$), the dangling bond and the film distortion are further decreased.

Further, in the case where the non-monocrystalline silicon carbide semiconductor films are laminated, the state of the interface is improved by limiting the size and the number of the microvoids as defined in the present invention.

In the non-monocrystalline silicon carbide semiconductor film of the present invention, by lowering the microvoid density to a level of $1 \times 10^{19}$ (cm$^{-3}$) or less, the facial density of the microvoid on an interface and on a surface can be decreased to less than $2 \times 10^{11}$ (cm$^{-1}$).

The average radius of not more than 3.5 Å of the microvoids improves the smoothness of the interface and the surface. Therefore, in the case where the non-monocrystalline silicon carbide semiconductor films are laminated, the interfacial level lowers and the strain at the interface decreases.

Furthermore, in the non-monocrystalline silicon carbide semiconductor of the present invention, impurity-doping efficiency is improved owing to the small average radius and small density of the microvoids. In other words, the smaller average radius and the lower density of the microvoids, and the less proportion of the C—H$_3$ bond as contained decrease the freedom degree of the non-monocrystalline silicon carbide semiconductor in comparison with that of the conventional ones. Consequently, in doping an impurity into the non-monocrystalline silicon carbide semiconductor of the present invention, the restriction force increases or the freedom degree decreases, thereby increasing the possibility of coordination of the impurity as a tetradentate and raising the efficiency of the impurity doping.

Furthermore, the non-monocrystalline silicon carbide semiconductor has advantages as mentioned below: the impurity added thereto is not readily diffused; close contactness is excellent in the case where a plurality of layers thereof are laminated; a junction of excellent characteristics can be formed therein; electric breakdown is caused less readily even in a thin film state; and the charge migrates more readily therein.

Accordingly, the non-monocrystalline silicon carbide semiconductor of the present invention will improve the properties of photoelectric transducing elements and semiconductor elements such as light-receiving members for electrophotography, solar cells, thin-film transistors, photosensors, and the like owing to the effects described above.

The non-monocrystalline silicon carbide semiconductor of the present invention is described below in more detail.

In the case where the non-monocrystalline silicon carbide semiconductor of the present invention is an amorphous silicon carbide semiconductor, the content of the hydrogen atom to be contained therein is preferably in the range of from 1 to 30 atomic %, more preferably from 5 to 25 atomic %, and the bonding state of the hydrogen is preferably such that the ratio of the peak area of the C—H$_3$ bond (the peak at 2960 cm$^{-1}$ in IR spectrum) to the peak area of the C—H bond (the peak at 2880 cm$^{-1}$ in IR spectrum), namely [C—H$_3$]/[C—H], is not higher than ⅕ (the peaks being assumed to be respectively in Gaussian distribution), and the ratio of the peak area of the Si—H$_2$ bond (the peak at 2090 cm$^{-1}$ in IR spectrum) to the Si—H bond (the peak at 2000 cm$^{-1}$), namely [Si—H$_2$]/[Si—H], is not higher than 1/20 (the peaks being assumed to be respectively in Gaussian distribution).

The content of halogen atoms (preferably fluorine atoms) to be contained in the amorphous silicon carbide semiconductor is preferably in the range of from 0.1 to 10 atomic %, more preferably from 0.1 to 5 atomic %.

The average radius of the microvoids to be contained in the amorphous silicon carbide semiconductor of the present invention is not more than 3.5 Å, and the density of the microvoids is preferably not higher than $1 \times 10^{19}$ (cm$^{-3}$).

On the other hand, in the case where the non-monocrystalline silicon carbide semiconductor of the present invention is a polycrystalline silicon carbide semiconductor, the content of the hydrogen atom to be contained therein is preferably in the range of from 0.1 to 10 atomic %, more preferably from 0.1 to 5 atomic %, and the bonding state of the hydrogen is preferably such that the ratio of the peak area of the C—H$_3$ bond (the peak of 2960 cm$^{-1}$ in IR spectrum) to the peak area of the C—H bond (the peak at 2880 cm$^{-1}$ in IR spectrum), namely [C—H$_3$]/[C—H], is not higher than ⅓ (the peaks being assumed to be respectively in Gaussian distribution), and the ratio of the peak area of the Si—H$_2$ bond (the peak at 2090 cm$^{-1}$ in IR spectrum) to the Si—H bond (the peak at 2000 cm$^{-1}$), namely [Si—H$_2$]/[Si—H], is not higher than 1/10 (the peaks being assumed to be respectively in Gauss distribution).

The content of halogen atoms (preferably fluorine atoms) in the polycrystalline silicon carbide semiconductor is preferably in the range of from 0.1 to 5 atomic %, more preferably from 0.1 to 3 atomic %.

The average radius of the microvoids to be contained in the polycrystalline silicon carbide semiconductor of the present invention is not more than 3.5 Å, and the density of the microvoids is preferably not higher than $1 \times 10^{19}$ (cm$^{-3}$).

The non-monocrystalline silicon carbide semiconductor of the present invention is suitable for uses for photoelectric transducing element and semiconductor elements such as electrophotographic light-receiving members, solar cells, thin-film transistors, photosensors, and the like. Examples of the application of the non-monocrystalline silicon carbide semiconductor of the present invention to such semiconductor apparatuses are described below.

Constitution Example 1: Application to Light-Receiving Member for Electrophotography FIG. 1 illustrates schematically an electrophotographic light-receiving member as an example of the semiconductor device employing the non-monocrystalline silicon carbide semiconductor of the present invention.

The electrophotographic light-receiving member 104 is constituted from a support 101, and a charge injection-preventing layer 102 and a photoconductive layer 103 laminated thereon.

The charge injection-preventing layer 102 contains, in addition to the non-monocrystalline silicon carbide semiconductor, preferably an element of Group IIIb of the Periodic Table for positive charging, or an element of Group Vb of the Periodic Table for negative charging. For the charge injection-preventing layer 102, microcrystalline silicon carbide semiconductors and polycrystalline silicon carbide semiconductors are suitable out of the non-monocrystalline silicon carbide semiconductors.

For the photoconductive layer 103, an amorphous silicon carbide semiconductor is particularly suitable out of the non-monocrystalline silicon carbide semiconductors. The layer thickness of the respective layers is suitably decided depending on the electrophotographic process. The layer thickness of the charge injection-preventing layer 102 is preferably in the range of from 100 Å to 10 μm, more preferably from 1000 Å to 7 μm, still more preferably from 5000 Å to 5 μm. The layer thickness of the photoconductive layer 103 is preferably in the range of from 1 μm to 100 μm, more preferably from 5 μm to 50 μm, still more preferably from 10 μm to 40 μm.

The electrophotographic image-forming member employing the non-monocrystalline silicon carbide semiconductor of the present invention has advantages of improved chargeability, improved sensitivity, substantially no residual potential, substantially no ghost formation, substantially no image flow, improved environmental resistance, extremely stable image quality, long life, and so forth.

Further, the electrophotographic light-receiving member employing the non-monocrystalline silicon carbide semiconductor of the present invention, particularly in an analogue copying machine, has advantages of excellent color reproducibility, and high sensitivity because the spectral sensitivity of the electrophotographic light-receiving member is approximate to the visual sensitivity of the human eye.

Furthermore, the electrophotographic light-receiving member employing the non-monocrystalline silicon carbide semiconductor of the present invention may suitably be of a functional-separation type depending on the electrophotographic process, in which the photoconductive layer is constituted of a charge-transporting layer employing a non-monocrystalline silicon carbide semiconductor and a charge-generating layer employing a non-monocrystalline silicon semiconductor.

Constitution Example 2: Application to Solar Cell

Figure 2:
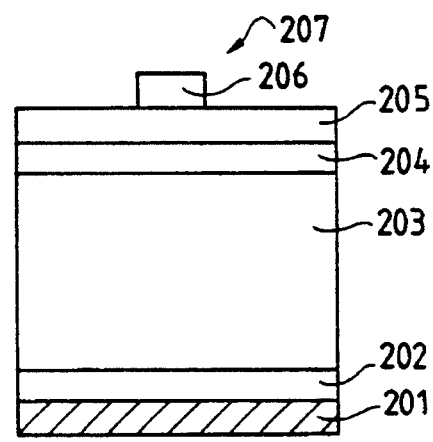
FIG. 2 illustrates schematically a layer constitution of a solar cell employing the non-monocrystalline silicon carbide semiconductor of the present invention.

FIG. 2 illustrates schematically a solar cell employing the non-monocrystalline silicon carbide semiconductor of the present invention.

In FIG. 2, the solar cell 207 is constituted from an electroconductive support 201, and an n-type layer 202, an i-type layer 203, a p-type layer 204, a transparent electroconductive layer 205, and an electricity-collecting electrode 206 laminated on the support. If necessary, a reflective layer or reflection-increasing layer may be provided between the electroconductive support 201 and the n-type layer 202. In the case where the support is light-transmissive and the light is projected from the support side, the layer constitution order is desirably reversed.

The n-type layer 202 and the p-type later 204 are formed preferably by adding respectively to the non-monocrystalline silicon carbide semiconductor a Group Vb element, and a Group IIIb element of the Periodic Table. Microcrystalline silicon carbide semiconductor and polycrystalline silicon carbide semiconductors are preferred from among the non-monocrystalline silicon carbide semiconductors of the present invention. The thickness of the n-type layer 202 and the p-type layer 204 are preferably in the range of from 1000 Å to 10 Å, more preferably from 200 Å to 10 Å, still more preferably from 100 Å to 20 Å.

In a solar cell, since an n-type layer or a p-type layer does not contributes to photoelectric current even when the cell absorbs light, the n-type layer and the p-type layer are desired to be made as thin as possible.

Although microvoids cause troubles when used in a thin film form, the non-monocrystalline silicon carbide semiconductor of the present invention has microvoids with a small average particle radius in a low density, thereby exhibiting sufficient performance even with a thin film of a several Å thickness.

For the i-type layer, the amorphous silicon carbide semiconductors and the polycrystalline silicon carbide semiconductors are suitable from among the non-monocrystalline silicon carbide semiconductors of the present invention. The thickness of the i-type layer is decided depending on the spectrum of the light in the environment where the solar cell is used, but is preferably in the range of from 500 Å to 1 μm.

Accordingly, the non-monocrystalline silicon carbide semiconductor of the present invention, when used in a solar cell, decreases the light absorption at the n-type layer or the p-type layer, thereby enabling sufficient light absorption at the i-type layer in photoelectric conversion. The non-monocrystalline silicon carbide semiconductor of the present invention is dense because of a small average radius and a small density of the microvoids. Therefore, the diffusion of the impurity from n-type layer or the p-type layer into the i-type layer is retarded sufficiently, and excellent pin junction can be formed. Similarly, the denseness of the n-type-layer or the p-type layer prevents the diffusion of a metal from the light-transmissive electroconductive layer such as of ITO and SnO$_2$. This is one of the reasons why the n-type layer or the p-type layer employing the non-monocrystalline silicon carbide semiconductor of the present invention exhibits sufficient performance in a state of an extremely thin film.

In the layer constitution of the solar cell employing the non-monocrystalline silicon carbide semiconductor of the present invention, the p-type layer or the n-type layer at the light-introduction side is more preferably crystallized to increase the photoelectric current, because the crystallization lowers the light absorption coefficient and improves the conversion efficiency particularly in the short wavelength range.

Further, in the layer constitution of the solar cell employing the non.-monocrystalline silicon carbide semiconductor of the present invention, the i-type layer may be formed from a non-monocrystalline silicon semiconductor or a non-monocrystalline silicon-germanium semiconductor which has a narrower band gap than the p-type layer or the n-type layer in order to increase the photoelectric current.

Furthermore, solar cells having a multilayer structure such as a tandem structure are preferable which is a lamination of a solar cell of a pin structure employing a noncrystalline silicon semiconductor as the i-type layer and another solar cell of a pin structure employing a noncrystalline silicon-germanium semiconductor.

Constitution Example 3: Application to Thin Film Transistor

Figure 3:
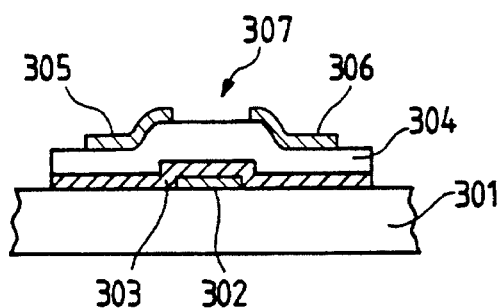
FIG. 3 illustrates schematically a layer constitution of a thin film transistor employing the non-monocrystalline silicon carbide semiconductor of the present invention.

FIG. 3 illustrates schematically a thin film transistor employing the non-monocrystalline silicon carbide semiconductor of the present invention.

The thin film transistor 307 is constituted an insulating support 301, and a gate electrode 302, an insulating layer 303, a semiconductor layer 304, a source electrode 305 and a drain electrode 306 formed thereon.

The non-monocrystalline silicon carbide semiconductor of the present invention used as the semiconductor layer 304 lowers the interfacial level at the interface adjacent to the insulating layer 303, to give excellent transistor characteristics, and stable transistor characteristics in repeated use.

Constitution Example 4: Application to Photosensor

Figure 4:
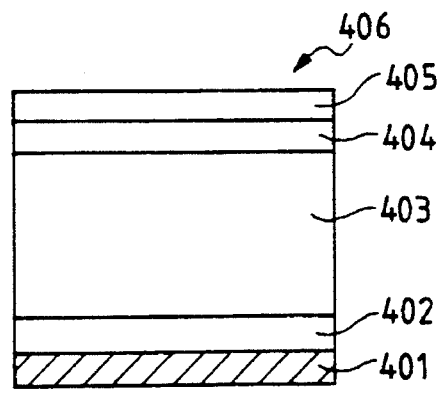
FIG. 4 illustrates schematically a layer constitution of a photosensor employing the non-monocrystalline silicon carbide semiconductor of the present invention.

FIG. 4 illustrates schematically a photosensor employing the non-monocrystalline silicon carbide semiconductor of the present invention.

The photosensor 406 is constituted from an electroconductive support 401, and an n-type or p-type layer 402 employing a non-monocrystalline silicon carbide semiconductor of the present invention, an i-type layer 403 employing a non-monocrystalline silicon carbide semiconductor of the present invention, and a p-type or n-type layer 404 employing the non-monocrystalline silicon carbide semiconductor of the present invention, and a transparent electroconductive layer 405 formed on the support.

The photosensor 406, whether it has a pin structure or a nip structure, is used by applying a reverse bias. The reverse bias is preferably in the range of from 1 V to 10 V. The thickness of the respective layers are the same as those of the solar cell. In photosensors, however, the p-type layer and the n-type layer are preferably thicker than those in the solar cells, since a reverse bias is applied.

The use of the non-monocrystalline silicon carbide semiconductor of the present invention gives advantages of such as less noise of dark current, high sensitivity, no residual image, no deterioration, and so forth.

In particular, in the photosensor of the present invention, the i-type layer is preferably a non-monocrystalline silicon semiconductor or a non-monocrystalline silicon-germanium semiconductor having a band gap narrower than those of the n-type layer or the p-type layer.

Production Process

A film-forming process of the non-monocrystalline silicon carbide semiconductor of the present invention is described below.

For formation of the film of the non-monocrystalline silicon carbide semiconductor of the present invention, a suitable process is microwave glow discharge decomposition by use of a silane type starting gas and a hydrocarbon type starting gas.

The starting gases suitable for the glow discharge decomposition process are shown below.

The starting gas for supplying Si effectively in the present invention includes gaseous or gasifiable silicon hydrides (namely silanes) such as $SiH_4$, $Si_2H_6$, $Si_3H_8$, $Si_4H_{10}$, of which $SiH_4$ and $Si_2H_6$ are preferred in view of the ease of handling in the film formation and the high efficiency of Si supply.

The carbon-containing compound for introducing carbon atoms used as the starting material in the present invention includes saturated hydrocarbons having 1 to 4 carbon atoms, ethylenic hydrocarbons having 2 to 4 carbon atoms, acetylenic hydrocarbons having 2 to 3 carbons.

Specifically, the saturated hydrocarbons include methane ($CH_4$), ethane ($C_2H_6$), propane ($C_3H_8$), n-butane (n-$C_4H_{10}$), and pentane ($C_5H_{12}$); the ethylenic hydrocarbons include ethylene ($C_2H_4$), propylene ($C_3H_6$), butent-1 ($C_4H_8$), butane-2 ($C_4H_8$), isobutylene ($C_4H_8$), and pentene ($C_5H_{10}$) and acetylenic hydrocarbons includes acetylene ($C_2H_2$), methylacetylene ($C_3H_4$) and butyne ($C_4H_6$), and the like.

As starting gases having atoms of Si, C, and H, there are mentioned alkyl silicides such as $Si(CH_3)_4$, $Si(C_2H_4)_4$, and the like.

Effective starting gases for introducing halogen employed in the present invention include various halogen compounds, preferably gaseous or gasifiable, such as halogen gases, halides, interhalogen compounds, halogen-substituted silane derivatives, and the like.

Further, gaseous or gasifiable halogen-atom-containing silicon compounds having silicon atom(s) an halogen atom(s) as the constituting elements are effective in the present invention.

The halogen compounds preferably used in the present invention include specifically halogen gases such as fluorine, chlorine, bromine, and iodine; and interhalogen compounds such as BrF, ClF, $ClF_3$, $BrF_5$, $BrF_3$, $IF_3$, $IF_7$, ICl, IBr, and the like.

The preferable halogen-atom-containing silicon compounds, which are halogen-substituted silane derivatives, include specifically halogenated silicons such as $SiF_4$, $Si_2F_6$, $SiCl_4$, $SiBr_4$, and the like.

Such a halogen-atom.-containing silicon compound is introduced into the deposition chamber, which is characteristic of the present invention, by glow discharge to form a plasma atmosphere of the introduced compound.

In addition o the above-mentioned halogen compounds and halogen-atom-containing silicon compounds which are effectively used as the halogen-introducing starting gas in the present invention, further examples of the effective starting material are gaseous or gasifiable halogen compounds having hydrogen atom(s) as the constituting element including hydrogen halides such as HF, HCl, HBr, HI, etc.; and halogan-substituted silicon hydride such as $SiH_2F_2$, $SiH_2I_2$, $SiH_2Cl_2$, $SiHCl_3$, $SiH_2Br_2$, $SiHBr_3$, etc. These hydrogen-containing halogen compounds are used as the suitable starting material for introducing halogen, since the compounds are capable of introducing halogen atoms into the formed layer during the layer formation and simultaneously introducing therein hydrogen atoms which are greatly effective in controlling electric and photoelectric characteristics.

In the case where glow discharge is employed for forming the layer containing a Group III element or a Group V element, the starting material gas for the layer formation is a mixture of a starting material for Si suitably selected from the above mentioned starting materials for Si and a starting gas for Group III atom introduction or Group V atom introduction. The starting material for introducing the Group III atoms or the Group V atoms may be any material which is a gaseous or gasified material having the Group III atom or the Group V atoms as constituting atoms.

The effectively employed starting material for introduction of the Group III atoms in the present invention includes specifically boron hydride such as $B_2H_6$, $B_4H_{10}$, $B_5H_9$, $B_5H_{11}$, $B_6H_{10}$, $B_6H_{12}$, and $B_6H_{14}$; and boron halides such as $BF_3$, $BCl_3$, and $BBr_3$; and the like. Further, $AlCl_3$, $GaCl_3$, $InCl_3$, $TlCl_3$, etc. are also included thereto.

The effectively employed starting material for introduction of the Group V atoms in the present invention includes specifically phosphorus hydride such as $PH_3$, and $P_2H_4$; phosphorous halides such as $PH_4I$, $PF_3$, $PF_5$, $PCl_3$, $PCl_5$, $PBr_3$, $PBr_5$, and $PI_3$. Further, $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$ are also included thereto.

A further starting gas is deuterium gas which has important function in forming the film of the non-monocrystalline silicon carbide semiconductor of the present invention.

The preferred ratio of the deuterium for film formation of the non-monocrystalline silicon carbide semiconductor is in the range of from 0.5 to 1.00 relative to the silane type starting gas and the hydrocarbon type starting gas.

The deuterium gas is activated by the energy of microwave to radiate ultraviolet rays. The intensity of the ultraviolet rays radiated by the deuterium gas is higher than that radiated by hydrogen gas. Accordingly, in the case where the film of the non-monocrystalline silicon carbide semiconductor is formed from the silane type starting material and the hydrocarbon type starting material with a deuterium gas added thereto by microwave glow discharge decomposition, the non-monocrystalline silicon carbide semiconductor can be formed into a film having microvoids of an average microvoid radius of not more than 3.5 Å in a density of not more than $1 \times 10^{19}$ cm$^{-3}$ by the action of ultraviolet rays radiated from the deuterium excited by microwave.

The ultraviolet rays radiated from the deuterium excited by the microwave excites the silane type starting gas and the hydrocarbon type starting gas in the gas phase to produce active species. The active species is considered to be more suitable for the film formation of the non-monocrystalline silicon carbide semiconductor of the present invention in comparison with the active species produced by microwave glow discharge decomposition of the no-deuterium containing starting gas.

The ultraviolet rays radiated by the deuterium is considered to activate and accelerate the surface reaction on the support to give the non-monocrystalline silicon carbide semiconductor of the present invention.

Further, the deuterium, which has a larger atomic weight than hydrogen, is considered to retard the photodegradation caused by the hydrogen incorporated into the non-monocrystalline silicon carbide semiconductor.

The conditions of the microwave glow discharge decomposition for the formation of the film of the non-monocrystalline silicon carbide semiconductor of the present invention are as follows.

The frequency of the microwave is preferably in the range of from 100 MHz to 10 GHz, the optimum being 2.45 GHz.

In the microwave discharge, a DC bias and an RF bias may be superposed. The DC bias is preferably applied such that the support side becomes negative, and the preferred DC bias is in the range of from 10 to 200 V. The RF bias preferably has a frequency in the range of from 500 kHz to 50 MHz, the optimum being 13.56 MHz. The RF bias power is most suitably in the range of from $5 \times 10^{-2}$ to 400 W/SCCM for the silicon type starting gas.

The superposition of a DC bias and an RF bias with the microwave glow discharge gives effects such as acceleration of the surface reaction on the surface of a support when a silane type starting gas and a hydrocarbon type sterting gas are decomposed and deposited on the surface of the support, decrease of the damage of the film-forming surface of the support caused by collision of electrons, end prevention of abnormal discharge caused by the RF bias depending on the shape of the reaction vessel.

In the microwave glow discharge decomposition for forming a film of the non-monocrystalline silicon carbide semiconductor of the present invention, the pressure at the glow discharge decomposition is an extremely important factor, end the pressure is preferably in the range of from 0.1 to 10 mTorr.

The power of the microwave is also an important factor, and the power is preferably in the range of from 1 to 10 W/SCCM for the silane type starting gase and the hydrocarbon type starting gases.

The temperature of the support at the film formation is an important factor affecting the film quality, and is to be decided suitably based on the deposition rate and the desired state of the non-monocrystalline silicon carbide semiconductor. (crystalline or amorphous). In slow formation of an amorphous semiconductor film at a deposition rate of several angstroms per second or less, the temperature of the support is desirably set relatively lower, preferably in the range of from 25° to 400° C. In slow formation of a crystalline silicon carbide semiconductor film at a deposition rate of several angstroms per second or less, the temperature of the support is desirably set relatively higher, preferably in the range of from 200° to 600° C. In rapid formation of a non-monocrystalline silicon carbide semiconductor film at a deposition rate of several ten angstroms per second or higher, the temperature of the support is desirably set relatively higher, preferably in range of from 250° to 650° C.

The present invention is described below in more detail by reference to examples without limiting the invention in any way.

EXPERIMENT 1

Test samples were prepared for measurement of impurity-doping efficiency, analysis of microvoids, and analysis of the crystallinity by using the non-monocrystalline silicon carbide semiconductor of the present invention through microwave glow discharge decomposition.

Figure 5:
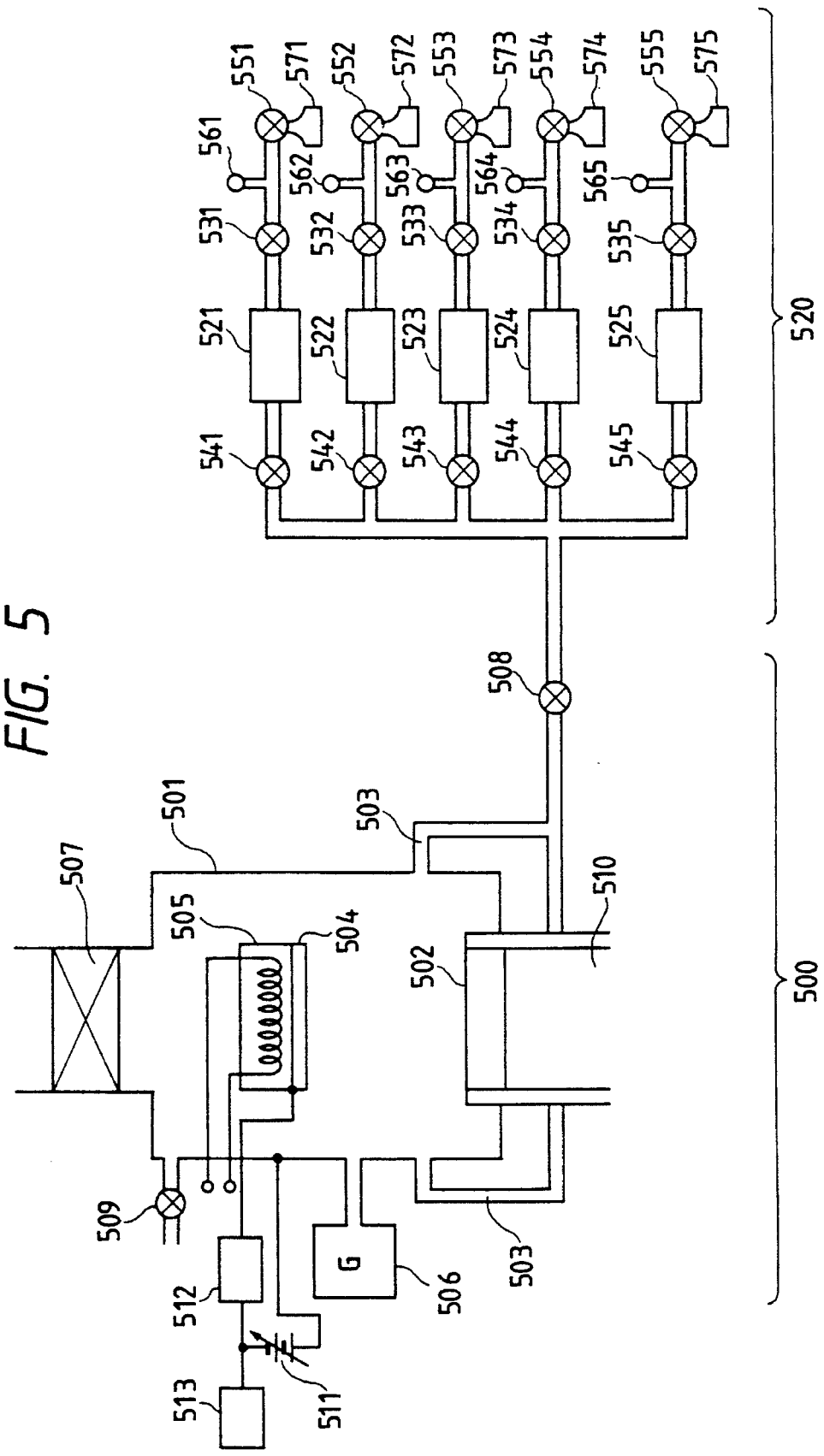
FIG. 5 illustrates schematically an example of the apparatus for producing a non-monocrystalline silicon carbide semiconductor of the present invention by microwave glow discharge.

FIG. 5 illustrates an apparatus for producing a non-monocrystalline silicon carbide semiconductor by microwave glow discharge decomposition. The apparatus is constituted of a starting-gas-feeding apparatus 520 and a film-forming apparatus 500.

In the drawing, the gas cylinders 571–575 hold the starting gases for producing the non-monocrystalline silicon carbide semiconductor of the present invention The cylinder 571 holds $SiH_4$ gas (purity: 99.99%). The cylinder 572 holds dueterum gas (purity: 99.6% hereinafter referred to as "$D_2$ gas"). The cylinder 573 holds $PH_3$ gas (purity: 99.999%) diluted to 10% with $H_2$ gas (hereinafter referred to as "$PH_3/H_2$ (10%) gas") or $PH_3$ gas (purity: 99.999%) diluted to 10 ppm with $H_2$ gas (hereinafter refered to as "$PH_3/H_2$ (10 ppm) gas"). The cylinder 574 holds $B_2H_6$ gas (purity: 99.999%) diluted to 10 % with $H_2$ gas (hereinafter referred to as "$B_2H_6/H_2$ (10%) gas"), or $B_2H_6$ gas (purity: 99.999%) diluted to 10 ppm with $H_2$ gas (hereinafter referred to as "$B_2H_6/H_2$ (10 ppm) gas"). The cylinder 575 holds $CH_4$ gas (purity: 99.999%).

When the gas cylinders 571–575 are connected to the starting gas feeding apparatus 520 before the experiment, gases are introduced respectively into the gas pipelines 531–535 through the valves 551–555, and the pressure of the respective gas is adjusted to 2 kg/cm$^2$ by the pressure controller 561–565. The gas cylinders 573 and 574 hold respectively either PH$_3$/H$_2$ (10%) or PH$_3$/H$_2$ (10 ppm), and either B$_2$H$_6$/H$_2$ (10%) or B$_2$H$_6$/H$_2$ (10 ppm) depending on the object of the experiment.

The support 504 is made of stainless steel (SUS304) of 50 mm square and 1 mm thick, and the surface thereof is mirror-polished and chromium (Cr) metal is deposited thereon in a thickness of 0.1 μm by electron-beam vapor deposition.

Firstly, the valves 551–555 were opened. After confirming the inlet valves 531–535 and the leak valve 509 of the film-forming chamber 501 being closed, and confirming the feeding valves 541–545 and the auxiliary valve 508 being opened, the conductance valve (butterfly type) 507 was fully opened, and the film forming chamber 501 and the gas lines were evacuated by means of a vacuum pump not shown in the drawing. When the vacuum gauge 506 came to indicate the pressure of approximately 1×10$^{-4}$ Torr, the auxiliary valve 508 and the feeding valves 541–545 were closed. Then the feeding valves 531–535 were opened slowly to introduce the respective gases to the mass flow controllers 521–525.

Thus the apparatus was ready for film formation. Then a film of the non-monocrystalline silicon carbide semiconductor was formed on the support 504.

The non-monocrystalline silicon carbide semiconductor was prepared in a manner as described below. The support 504 was heated with the heater 505 to 300° C. The feeding valves 541, 542, and 545, and the auxiliary valve 508 and, if necessary, the feeding valve 543 and 544 were gradually opened to feed SiH$_4$ gas, D$_2$ gas, and CH$_4$ gas, and, as required, PH$_3$/H$_2$ (10%) gas, PH$_3$/H$_2$ (10 ppm) gas, B$_2$H$_6$/H$_2$ (10%) gas, and B$_2$H$_6$/H$_2$ (10 ppm) gas through the gas-introducing pipe 503 into the film-forming chamber 501. The flow rate of SiH$_4$ gas was controlled to 5 SCCM, D$_2$ gas to 100 SCCM, and CH$_4$ gas to 1 SCCM, and the flow rates of PH$_3$/H$_2$ (10%) gas, PH$_3$/H$_2$ (10 ppm) gas, B$_2$H$_6$/H$_2$ (10%) gas, and B$_2$H$_6$/H$_2$ (10 ppm) gas were controlled respectively to the value shown in Table 1, respectively by means of the mass flow controllers 521–525. The pressure in the film-forming chamber 501 was adjusted to 0.8 mTorr by controlling the opening of the conductance valve 507 by reference to the vacuum gauge 506.

Then, a DC bias of −120 V was applied to the film-forming chamber 501 by the DC source 511, and further an RF power of 1.5 mW/cm$^3$ was applied to the support 504 by the RF source 513, through the matching box 512.

With a microwave power source not shown in the drawing set at the level of 90 mW/cm$^3$, a microwave power was introduced into the film-forming chamber 501 through a waveguide tube not shown in the drawing, the waveguide portion 510, and the dielectric window 502 to generate microwave glow discharge therein, thereby starting the formation of a non-monocrystalline silicon carbide semiconductor on the support 504. At the time when the non-monocrystalline silicon carbide semiconductor had grown to have a layer thickness of 3 μm, the preparation of the non-monocrystalline silicon carbide semiconductor was finished by stopping the microwave glow discharge, cutting the power supplies from the DC source 511 and the RF source 513, and closing the feeding valves 541–545 and the auxiliary valve 508 to stop the gas introduction to the film-forming chamber 501.

Subsequently, on the surface of the resulting non-monocrystalline silicon carbide semiconductor, chromium metal was deposited as an upper electrode in a dimension of 2 mm in diameter and 0.1 μm in thickness by electron beam vapor deposition. In such a manner, samples not doped with an impurity, doped with a small quantity of an impurity, and doped in a large quantity of an impurity were prepared for measurement of doping efficiency (Sample Nos. Exp. 1-1 to Exp. 1-9).

The conditions of the preparation of the samples for the measurement of impurity-doping efficiency are shown in Table 2.

Comparative Experiment 1

Test samples were prepared for measurement of impurity-doping efficiency, analysis of microvoids, and analysis of crystallinity by using a conventional non-monocrystalline silicon carbide semiconductor through high frequency glow discharge decomposition.

Figure 6:
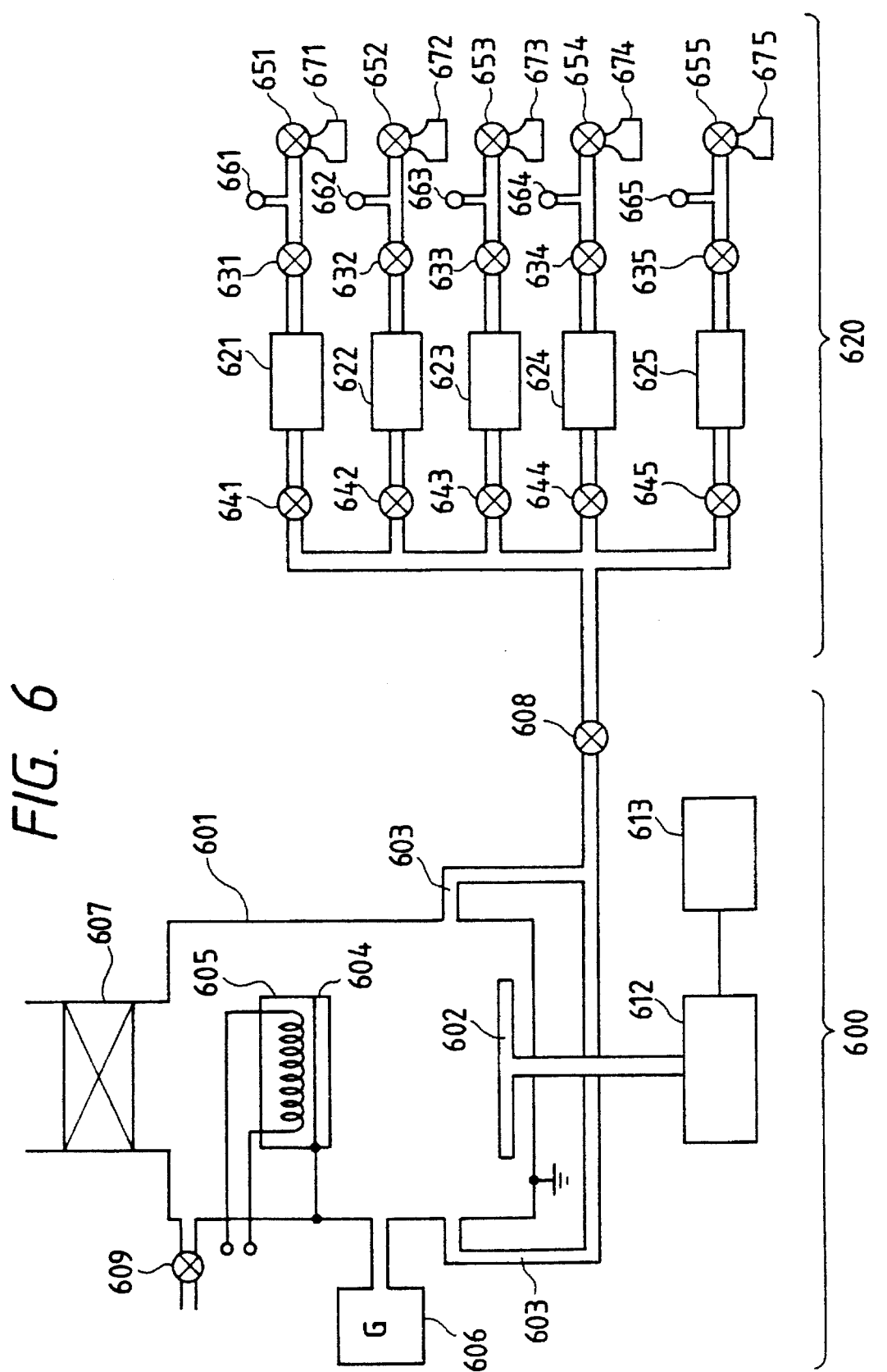
FIG. 6 illustrates schematically an apparatus for producing a conventional non-monocrystalline silicon carbide semiconductor by high-frequency glow discharge.

FIG. 6 illustrates an apparatus for producing a non-monocystalline silicon carbide semiconductor by high-frequency glow discharge decomposition. The apparatus is constituted of a starting-gas-feeding apparatus 620 and a film-forming apparatus 600.

In the drawing, the Gas cylinders 671–675 hold the starting gases for producing the conventional non-monocrystalline silicon carbide semiconductor. The cylinders are the same as those in the starting-gas-feeding apparatus 520 in Example 1, except that the cylinder 672 holds H$_2$ gas (purity: 99.9999%). Preliminarily, in the same manner as in Example 1, each gas was introduced into the gas line with adjustment of the pressure, and the gas cylinders 673 and 674 are changed according to the object of the experiment.

In the drawing, the support 604 is the same as the one in Example 1.

Firstly, in the same manner as in Example 1, the gases were introduced into the mass flow controllers 621–625, making the apparatus ready for film formation. Then a non-monocrystalline silicon carbide semiconductor film was formed on the support 604.

The non-monocrystalline silicon carbide semiconductor was prepared in a manner as described below. The support 604 was heated with the heater 605 to 250° C. The feeding valves 641, 642, and 645, and the auxiliary valve 608, and if necessary, the feeding valve 643 and 644 were gradually opened to feed SiH$_4$ gas, H$_2$ gas, and CH$_4$ gas, and, as required, PH$_3$/H$_2$ (10%) gas, PH$_3$/H$_2$ (10 ppm) gas, B$_2$H$_6$/H$_2$ (10%) gas, and B$_2$H$_6$/H$_2$ (10 ppm) gas through the gas-introducing pipe 603 into the film-forming chamber 601. The flow rate of SiH$_4$ gas was controlled to 1 SCCM, H$_2$ gas to 100 SCCM, and CH$_4$ gas to 0.2 SCCM, and the flow rates of PH$_3$/H$_2$ (10%) gas, PH$_3$/H$_2$ (10 ppm) gas, B$_2$H$_6$/H$_2$ (10%) gas, and B$_2$H$_6$/H$_2$ (10 ppm) gas were controlled respectively to the value shown in Table 3, respectively by means of the mass flow controllers 621–625. The pressure in the film-forming chamber 601 was adjusted to 1 Torr by controlling the opening of the conductance valve 607 by reference to the vacuum gauge 606.

With a high frequency power source 613 set at the level of 7 mW/cm$^3$, a high frequency power was introduced to the cathode 602 through a matching box 612 to cause high frequency glow discharge, thereby starting the formation of a non-monocrystalline silicon carbide semiconductor on the support 604. At the time when the non-monocrystalline silicon carbide semiconductor had grown to have a layer thickness of 3 µm, the preparation of the non-monocrystalline silicon carbide semiconductor was finished by stopping the high frequency glow discharge, and closing the feeding valves 641–645 and the auxiliary valve 608 to stop the gas introduction to the film-forming chamber 601.

Subsequently, the samples for measurement of the impurity-doping efficiency were prepared which were similar to the ones of Experiment 1 by vapor-depositing an upper electrode on the surface of the non-monocrystalline silicon carbide semiconductor in the same manner as Experiment 1 (Sample Nos. Comp. 1-1 to 1-9).

The conditions for preparing the samples for measurement of impurity-doping efficiency are shown in Table 4.

The samples for measurement of impurity-doping efficiency of Experiment 1 (Sample Nos. Exp. 1-1 to Exp. 1-9) and Comparative Experiment 1 (Sample Nos. Comp. 1-1 to Comp. 1-9) were placed in a cryostat (WM-365, made by Sanwa Musen Keiki Kenkyusho). By applying a voltage between the upper electrode and the stainless support by means of a pA meter (4140B, made by Yokogawa Hewlett Packard K. K.), the electric current (Id) flowing between the two electrode was measured with the temperature (T: absolute temperature) of the samples for measurement of impurity-doping efficiency being varied during the measurement. From the measured data, the activation energies of the non-monocrystalline silicon carbide semiconductors were determined from the gradient of the plots of natural logarithm of the current (log Id) against the reciprocal of the temperature (1/T) multiplied by $-8.6 \times 10^{-5}$.

As the result, the non-monocrystalline silicon carbide semiconductors of Experiment 1 (Sample No. Exp. 1-5) and Comparative Experiment 1 (Sample No. Comp. 1-5), which were not doped, showed approximtely the same activation energy value. However, in the case where a small quantity of the impurity was doped, the rate of change of the activation energy of the non-monocrystalline silicon carbide semiconductor of Experiment 1 (Sample Nos. Exp. 1-3, 1-4, 1-6 and 1-7) was larger by a factor of from 1.8 to 2.5 than that of Comparative Experiment 1 (Sample Nos. Comp. 1-3, 1-4, 1-6, and 1-7). In the case where a large quantity of the impurity was doped, the activation energy of the non-monocrystalline silicon carbide semiconductor of Experiment 1 (Sample Nos. Exp. 1-1, 1-2, 1-8 and 1-9) was 0.5 to 0.65 times that of Comparative Experiment 1 (Sample Nos. Comp. 1-1, 1-2, 1-8 and 1-9). Thereby it was found that the samples for measurement of impurity doping efficiency employing the non-monocrystalline silicon carbide semiconductor of the present invention (Sample Nos. Exp. 1-1 to 1-9) shows greater rate of change of the activation energy and higher doping efficiency than the ones of Comparative Experiment (Sample Nos. Comp. 1-1 to 1-9). Thus the effect of the present invention was proved.

The samples for analysis of the microvoids were prepared by forming a film in a thickness of 3 µm on a high-purity aluminum foil of 5 mm square and 10 µm thick under the same preparation conditions as in Experiment 1 and Comparative Experiment 1. The average radius, and the density of the microvoids in the non-monocrystalline silicon carbide semiconductors were measured by means of a small angle X-ray scattering apparatus (RAD-III b, made by Rigaku Denki K. K.). The small angle X-ray scattering measurements have been described in the aforementioned articles by A. H. Mahan et al. As described in these articles, the radius of gyration Rg is determined by the slopes of the Guinier SAXS plots (lnI vs. $h^2$) and the average radius is calculated by $(5/3)^{1/2}$Rg. Consequently, the non-monocrystalline silicon carbide semiconductor of Experiment 1 had microvoids of an average radius of from 2.8 to 3.3 Å in a density of from 6.6 to $8.7 \times 10^{18}$ cm$^{-3}$, while the one of the Comparative Experiment 1 had an average radius of from 3.7 to 4.1 Å in a density of 2.2 to $3.5 \times 10^{19}$ cm$^{-3}$. The microvoids in the non-monocrystalline silicon carbide semiconductor had a smaller average diameter and is in a lower density in Experiment 1 than Comparative Experiment 1.

The samples for analysis of the microvoids and the crystallinity were prepared by forming a film in a thickness of 3 µm on a stainless steel support of 5 mm square and 1 mm thick under the same preparation conditions as in Experiment 1 and Comparative Experiment 1. The microvoids on the surface of the non-monocrystalline silicon carbide semiconductor were observed by means of STM (Nanoscope Model II, made by Digital Instrument Co.). The non-monocrystalline silicon carbide semiconductor of Experiment 1 had microvoids of smaller radius and less in number than that of Comparative Experiment 1. The crystallinity of the non-monocrystalline silicon carbide semiconductor was evaluated by means of RHEED (JEM-100SX, made by Nippon Denshi K. K.(JEOL Ltd.)). Both of the samples of Experiment 1 and Comparative Experiment 1 showed ring-shape patterns, and found to be amorphous (containing microcrystals).

EXPERIMENT 2

A non-monocrystalline silicon carbide semiconductor element which is constituted of a p-type layer, an i-type layer, and an n-type layer was prepared employing the non-monocrystalline silicon carbide semiconductor of the present invention with the same apparatus under the same preparation conditions as in Experiment 1.

The support 504 was a stainless steel sheet of 50 mm square and 1 mm thick, mirror-polished at the surface.

The preparation procedure is described by reference to FIG. 5.

The p-type layer was prepared as below. The support 504 was heated to 300° C. by the heater 505. Into the film-forming chamber 501, SiH$_4$ gas at a rate of 5 SCCM, D$_2$ gas at a rate of 100 SCCM, CH$_4$ gas at a rate of 1 SCCM, and B$_2$H$_6$/H$_2$ (10%) gas at a rate of 5 SCCM were introduced by controlling the internal pressure of the film-forming chamber 501 at 0.8 mTorr in the same manner as in Experiment 1. Then the p-type layer was prepared in a thickness of 10 nm on the support 504 under the conditions of a DC bias of −120 V, a high-frequency power of 1.5 mW/cm$^3$ and a microwave power of 90 mW/cm$^3$ in the same manner as in Experiment 1.

Then, the i-type layer was prepared as below. The support 504 was heated to 300° C. by the heater 505. Into the film-forming chamber 501, SiH$_4$ gas at a rate of 5 SCCM, D$_2$ gas at a rate of 100 SCCM, and CH$_4$ gas at a rate of 1 SCCM were introduced by controlling the internal pressure of the film-forming chamber 501 at 0.8 mTorr in the same manner as in Experiment 1. Then the i-type layer was prepared in a thickness of 500 nm on the p-type layer under the conditions of a DC bias of −120 V, a high-frequency power of 1.5 mW/cm$^3$, and a microwave power of 90 mW/cm$^3$ in the same manner as in Experiment 1.

Subsequently, the n-type layer was prepared as below. The support 504 was heated to 300° C. by the heater 505. Into the film-forming chamber 501, SiH$_4$ gas at a rate of 5 SCCM, D$_2$ gas at a rate of 100 SCCM, CH$_4$ gas at a rate of 1 SCCM, and PH$_3$/H$_2$ (10%) gas at a rate of 5 SCCM were introduced by controlling the internal pressure of the film-forming chamber 501 at 0.8 mTorr in the same manner as in Experiment 1. Then the n-type layer was prepared in a thickness of 10 nm on the i-type layer under the conditions of a DC bias of −120 V, a high-frequency power of 1.5 mW/cm$^3$ and a microwave power of 90 mW/cm$^3$ in the same manner as in Experiment 1.

Naturally, in the preparation of the respective layers, only the necessary valves of the feeding valves 541–545 were opened. To avoid the remaining of the respective gas in the film-forming chamber 501 and in the pipe lines from the feeding valves 541–545 to the film-forming chamber 501, the systems were evacuated once as desired to a high vacuum with the feeding-valves 541–545 closed, the auxiliary valve 508 opened, and the conductance valve 507 fully opened.

Onto the n-type layer of the resulting non-monocrystalline silicon carbide semiconductor element, ITO ($In_2O_3+SnO_2$) as transparent conductive layer, was vapor-deposited in a size of 6 mm diameter and 70 mm thick by a resistance heating method.

As described above, the non-monocrystalline silicon carbide semiconductor element was completed (Sample No. Exp. 2).

The conditions of preparation of the above non-monocrystalline silicon carbide semiconductor element are shown in Table 5.

Comparative Experiment 2

A non-monocrystalline silicon carbide semiconductor element constituted of a p-type layer, an i-type layer, and an n-type layer which are made of conventional non-monocrystalline silicon carbide semiconductor, was prepared with the same prepartion apparatus under the same preparation conditions as in Comparative Experiment 1.

The support employed was the same stainless steel plate as the one employed in Experiment 2.

The preparation procedure is described by reference to FIG. 6.

The p-type layer was prepared as below. The support 604 was heated to 250° C. by the heater 605, and into the film-forming chamber 601, $SiH_4$ gas at a rate of 1 SCCM, $H_2$ gas at a rate of 100 SCCM, $CH_4$ gas at a rate of 0.2 SCCM, and $B_2H_6/H_2$ (10%) gas at s rate of 1 SCCM were introduced by controlling the internal pressure of the film-forming chamber 601 at 1 Torr in the same manner as in Comparative Experiment 1. Then the p-type layer was prepared in a thickness of 10 nm on the support 604 under the conditions a high-frequency power of 7 mW/cm$^3$ in the same manner as in Comparative Experiment 1.

Then, the i-type layer was prepared as below. The support 604 was heated to 250° C. by the heater 605, and into the film-forming chamber 601, $SiH_4$ gas at a rate of 1 SCCM, $H_2$ gas at a rate of 100 SCCM, and $CH_4$ gas at a rate of 0.2 SCCM were introduced by controlling the internal pressure of the film-forming chamber 601 at 1 Torr in the same manner as in Comparative Experiment 1. Then the i-type layer was prepared in a thickness of 500 nm on the p-type layer under the conditions a high-frequency power of 7 mW/cm$^3$ in the same manner as in Comparative Experiment 1.

Subsequently, n-type layer was prepared as below. The support 604 was heated to 250° C. by the heater 605, and into the film-forming chamber 601, $SiH_4$ gas at a rate of 1 SCCM, $H_2$ gas at a rate of 100 SCCM, $CH_4$ gas at a rate of 0.2 SCCM, and $PH_3/H_2$ (10%) gas at a rate of 1 SCCM were introduced by controlling the internal pressure of the film-forming chamber 601 at 1 Torr in the same manner as in Comparative Experiment 1. Then the n-type layer was prepared in a thickness of 10 nm on the i-type layer under the condition of a high-frequency power of 7 mW/cm$^3$ in the same manner as in Comparative Experiment 1.

Naturally, in the preparation of the respective layers, only the necessary valves of the feeding valves 641–645 were opened. To avoid the remaining of the respective gas in the film-forming chamber 601 and in the pipe lines from the feeding valves 641–645 to the film-forming chamber 601, the systems were evacuated once as desired to a high vacuum in the same manner as in Experiment 2.

Onto the n-type layer of the resulting non-monocrystalline silicon carbide semiconductor element, a transparent electroconductive layer was vapor-deposited in the same manner as in Example 2.

As described above, the non-monocrystalline silicon carbide semiconductor element was completed (Sample No. Comp. 2).

The conditions of preparation of the above non-monocrystalline silicon carbide semiconductor element are shown in Table 6.

The non-monocrystalline silicon carbide semiconductor elements prepared in Experiment 2 (Sample No. Exp. 2) and Comparative Experiment 2 (Sample No. Comp. 2) were subjected to measurement of current-voltage characteristics by applying a voltage between the transparent conductive layer and the stainless support by means of a pA meter (4140B, made by Yokogawa Hewlett Packard K. K.), and therefrom the n value of the pn junction was derived according to the method described in "Physics of Semiconductor Devices" (Second edition, written by S. M. Sze, published by John Wiley & Sons), pp. 89–92. The n value of the non-monocrystalline silicon carbide semiconductor element of Experiment 2 (Sample No. Exp. 2) was smaller by a factor of 0.83 than the one of Comparative Experiment 2 (Sample No. Comp. 2). Thus better characteristics of a pn junction is obtained by use of the non-monocrystalline silicon carbide semiconductor of the present invention in comparison with conventional ones.

The contents of phosphorus atoms (P) and boron atoms (B) in the i-type layers of the non-monocrystalline silicon carbide semiconductor elements of Experiment 2 (Sample No. Exp. 2) and Comparative Experiment 2 (Sample No. Comp. 2) were determined by means of a secondary ion mass analyzer (IMS-3F, made by CAMECA). The phosphorus (P) content in the non-monocrystalline silicon carbide semiconductor element of Experiment 2 (Sample No. Exp. 2) was lower by a factor of 0.6, and the boron (B) content therein was lower by a factor of 0.35 than those of Comparative Experiment 2 (Sample No. Comp. 2), which shows that the diffusion of the impurity is retarded in the non-monocrystalline silicon carbide semiconductor of the present invention in comparison with that in conventional ones.

EXPERIMENT 3

A non-monocrystalline silicon carbide semiconductor element was prepared in the same manner as in Experiment 2 except that an n-type layer, an i-type layer, a p-type layer, and a transparent conductive layer were formed in this order on the stainless support and the thickness of the i-type layer was made 3 μm (Sample No. Exp. 3).

Comparative Experiment 3

A non-monocrystalline silicon carbide semiconductor element was prepared in the same manner as in Comparative Experiment 2 except that an n-type layer, an i-type layer, a p-type layer, and a transparent electroconductive layer were formed in this order on the stainless support and the thickness of the i-type layer was 3 μm (Sample No. Comp. 3).

The electron mobilities and the hole mobilities were measured of the non-monocrystalline silicon carbide semiconductor elements of Experiment 2 (Sample No. Exp. 2), Experiment 3 (Sample No. Exp. 3), Comparative Experiment 2 (Sample No. Comp. 2), and Comparative Experiment 3 (Sample No. Comp. 3) according to the time-of-flight method described in "Semiconductors and Semimetals", Vol. 21, Part C, Chapter 6 (written by T. Tiedje, published by Academic Press). The hole mobility of the non-monocrystalline silicon carbide semiconductor element of Experiment 2 (Sample No. Exp. 2) was larger by a factor of 3.4 than that of Comparative Experiment 2 (Sample No. Comp. 2), an the electron mobility of the non-monocrystalline silicon carbide semiconductor element of Experiment 3 was larger by a factor of 2.1 than that of Comparative Experiment 3 (Sample No. Comp. 3), which shows that charges are more readily mobile in the non-monocrystalline silicon carbide semiconductor of the the present invention than in conventional ones.

EXPERIMENT 4

A non-monocrystalline silicon carbide semiconductor element was prepared in the same manner as in Experiment 2 except that the thicknesses of the p-type layer and the n-type layer were respectively made 2 nm (Sample No. Exp. 4).

Comparative Experiment 4

A non-monocrystalline silicon carbide semiconductor element was prepared in the same manner as in Comparative Experiment 2 except that the thicknesses of the p-type layer and the n-type layer were respectively made 2 nm (Sample No. Comp. 4).

The leak current caused by the reverse bias voltage was measured of the non-monocrystalline silicon carbide semiconductor elements of Experiment 2 (Sample No. Exp. 2), Experiment 4 (Sample No. Exp. 4), Comparative Experiment 2 (Sample No. Comp. 2), and Comparative Experiment 4 (Sample No. Comp. 4) by measuring current-voltage characteristics on application of a voltage between the transparent conductive layer and the stainless steel support by means of a pA meter (4140B, made by Yokogawa Hewlett Packard K. K.). As the results, the leak current of the non-monocrystalline silicon carbide semiconductor element of Experiment 2 (Sample No. Exp. 2) was smaller by a factor of 0.52 than that of Comparative Experiment 2 (Sample No. Comp. 2), and that of Experiment 4 was smaller by a factor of 0.06 than that of Comparative Experiment 4 (Sample No. Comp. 4), which shows that the non-monocrystalline silicon carbide semiconductor of the present invention can be used in a thinner film form in comparison with conventional non-monocrystalline silicon carbide semiconductor.

EXPERIMENT 5 AND COMPARATIVE EXPERIMENT 5

Samples for analysis of microvoids and crystallinity were prepared (Sample Nos.: Exp. 5-1 to 5-3 and Comp. 5) were prepared on high-purity aluminum foil of 5 mm square and 10 μm thick and a stainless steel support (SUS304) of 5 mm square and 1 mm thick in a similar manner as in Experiment 1 at the flow rate of $D_2$ gas and $H_2$ gas varied as shown in Table 7 and under the preparation conditions in Table 8. Separately, a non-monocrystalline silicon carbide semiconductor elements (Sample No. Exp. 5-1 to 5-3 and Comp. 5) were prepared on stainless supports of 50 mm square and 1 mm thick at the flow rate of $D_2$ gas or $H_2$ gas varied as shown in Table 7 and under the preparation conditions in Table 9.

The samples for analysis of microvoids and crystallinity (Sample Nos.: Exp. 5-1 to 5-3 and Comp. 5) were subjected to measurement of average radius and density by means of the small angle X-ray scattering apparatus and to measurement of crystallinity of the non-monocrystalline silicon carbide semiconductor by means of RHEED in the same manner as in Experiment 1. The results are shown in FIG. 7.

The above prepared non-monocrystalline silicon carbide semiconductor elements (Sample No. Exp. 5-1 to 5-3 and Comp. 5) were subjected to measurement of n values of pn junction, and hole mobility and leak current at the reverse bias in the non-monocrystalline silicon carbide semiconductor in the same manner as in Experiments 2 to 4. The results are shown in FIG. 7 in terms of relative values taking the values of non-monocrystalline silicon carbide semiconductor element of Comparative Experiment 5 (Sample No. Comp. 5) as 1.

Figure 7:
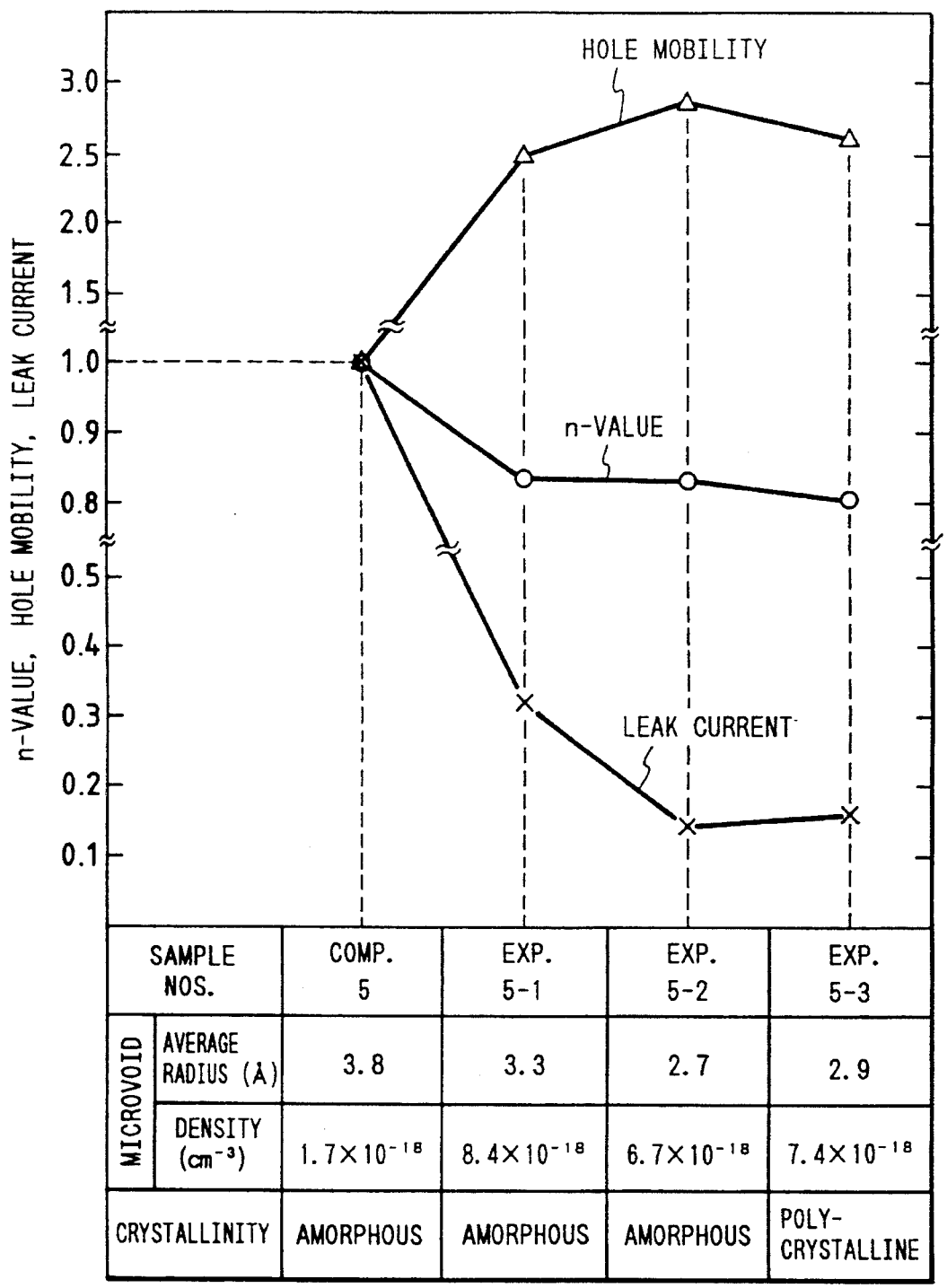
FIG. 7 shows the correlation between hole mobilities, n values and leak current and average radius of microvoids, densities of microvoids, and crystallinity of non-monocrystalline silicon carbide semiconductors of the present invention and of a conventional one.

From FIG. 7, it is understood that the non-monocrystalline silicon carbide semiconductor elements of the present invention having an average diameter of not more than 3.5 Å in a density of not more than $1\times10^{19}$ cm$^{-3}$ (Element Nos.: Exp. 5-1 to 5-3) have excellent characteristics in the n value, the hole mobility, and the leak current in comparison with the conventional one (Sample No. Comp. 5). Thus the effects of the present invention have been proved.

The present invention is described further in detail by reference to Examples without limiting the invention in any way.

EXAMPLE 1

(Solar Cell)

On an electroconductive stainless steel support (SUS304) of 50 mm square and 1 mm thick and mirror-polished at the surface, there were vapor-deposited a thin silver film of 0.1 μm thick as reflective layer, and thereon a thin ZnO film of 1 μm thick as a reflection-increasing layer by a sputtering method. On this electroconductive support, an n-type layer, an i-type layer, and a p-type layer were formed in this order under the conditions of Table 10 in the same manner as in Experiment 2. Further on the p-type layer, ITO was vapor-deposited in a dimension of 1 cm square and 70 nm thick in this order as a light-transmissive electroconductive layer in the same manner as in Experiment 2. Further thereon, metallic aluminum (Al) was vapor-deposited in a thickness of 2 μm by electron-beam vapor-deposition. Thus a solar cell was completed (Solar cell No. Ex. 1).

Comparative Example 1

(Solar Cell)

A solar cell was prepared in the same manner as in Example 1 except that the n-type layer, the i-type layer, and the p-type layer were prepared under the conditions of Table 11 in the same manner as in Comparative Experiment 2 (Solar cell No. Comp. Ex. 1).

The solar cells of Example 1 (Solar cell No. Ex. 1) and Comparative Example 1 (Solar cell No. Comp. Ex. 1) were tested for evaluation of initial characteristics and deterioration of the characteristics.

The initial characteristics of the solar cells of Example 1 (Solar cell No. Ex. 1) and Comparative Example 1 (Solar cell No. Comp. Ex. 1) were evaluated by exposing the solar cells to light irradiation at AM-1.5 (100 mW/cm$^2$) and measuring the photoelectric conversion efficiencies. As the results, the solar cell of Example 1 (Cell No. Ex. 1) exhibited a photoelectric conversion efficiency of 1.35 times that of Comparative Example 1 (Cell No. Comp. Ex. 1).

The deterioration of the solar cells of Example 1 (Solar cell No. Ex. 1) and Comparative Example 1 (Solar cell No. Comp. Ex. 1) were evaluated by exposing the solar cells to light irradiation at AM-1.5 (100 mW/cm$^2$) for 100 hours and thereafter. measuring the photoelectric conversion efficiencies at AM-1.5 (100 mW/cm$^2$) in the same manner as for the initial properties. As the results, the solar cell of Example 1 (Cell No. Ex. 1) exhibited a photoelectric conversion efficiency of 1.5 times that of Comparative Example 1 (Cell No. Comp. Ex. 1).

Consequently, the solar cells employing the non-monocrystalline silicon carbide semiconductor of the present invention was found to have excellent characteristics of a solar cell.

EXAMPLE 2

(Photosensor)

On an electroconductive stainless steel support (SUS304) of 50 mm square and 1 mm thick, mirror-polished at the surface, an n-type layer, an i-type layer, and a p-type layer were formed in this order and further on the p-type layer, ITO was vapor-deposited in a dimension of 2.5 mm diameter and 100 nm thick as a transparent electroconductive layer in the same manner as in Example 1. Thus a photosensor was completed (Sensor No. Ex. 2).

Comparative Example 2

(Photosensor)

A photosensor was prepared in the same manner as in Comparative Example 1 except that the n-type layer, the i-type layer, and the p-type layer were prepared the the same manner as in Example 2 (Sensor No. Comp. Ex. 2).

The photoresponsiveness was evaluate of the photosensors prepared in Example 2 (Sensor No. Ex. 2) and Comparative Example (Sensor No. Comp. Ex. 2) by projecting argon laser light intermittently b use of a chopper and measuring the rise or fall of the current flowing between the electroconductive support the transparent electroconductive layer by means of an oscilloscope (Model 2430, made by Sony Techtroniques K.K.). As the results, the photoresponsiveness of the photosensor (Sensor No. Ex. 2) was higher by a factor of 3.1 than that of the Comparative Example 2 (Sensor No. Comp. Ex. 2).

Consequently, the photosensor employing the non-monocrystalline silicon carbide semiconductor of the present invention was found to have excellent characteristics of a photosensor.

EXAMPLE 3

(Thin Film Transistor)

On an insulating support made of barium borosilicate glass (7059, made by Corning Co.) of 50 mm square and 0.8 mm thick, metallic chromium (Cr) was deposited in a dimension of 16 µm wide, 100 µm long, and 100 nm thick as the gate electrode by electron-beam vapor-deposition. On this gate electrode, silicon nitride was vapor-deposited in a dimension of 50 µm wide, 100 µm long, and 500 nm thick as an insulating layer by glow discharge decomposition. On the insulating layer, a non-monocrystalline silicon carbide semiconductor layer was formed in a dimension of 50 µm wide, 100 µm long, and 500 nm thick in the same manner as the formation of i-type layer in Example 1. Further thereon, metallic chromium (Cr) was deposited by electron beam vapor-deposition as the source electrode and the drain electrode respectively in a dimension of 10 µm wide, 100 µm long, and 100 nm thick with a space of 10 µm between the source electrode and the drain electrode. Thus a thin film transistor was completed (TFT No. Ex. 3).

Comparative Example 3

(Thin Film Transistor)

A thin film transistor was prepared in the same manner as in Example 3 except that the non-monocrystalline silicon carbide semiconductor layer was prepared under the same conditions as in the formation of the i-type layer in Comparative Example 1 (TFT No. Comp. Ex. 3).

The thin film transistors prepared in Example 3 (TFT No. Ex. 3) and Comparative Example 3 (TFT NO. Comp. Ex. 3) were connected with a pA meter (4140B, made by Yokogawa Hewlett Packard K. K.), and the current flowing between the source electrode and the drain electrode when a voltage is applied between the Gate electrode and the source electrode was measured to evaluate the ON current and the ON-OFF current ratio. As the results, the thin film transistor of Example 3 (TFT No. Ex. 3) exhibited the ON current of 3.6 times than that of, and the ON-OFF current ratio of 5.8 times that of the thin film transistor of Comparative Example 3 (TFT No. Comp. Ex. 3).

Consequently, the thin film transistor employing the non-monocrystalline silicon carbide semiconductor of the present invention was found to have excellent transistor characteristics.

EXAMPLE 4

(Light-Receiving Member for Electrophotography)

An electrophotographic light-receiving member was prepared by employing the non-monocrystalline silicon carbide semiconductor of the present invention by microwave glow discharge decomposition.

Figure 8:
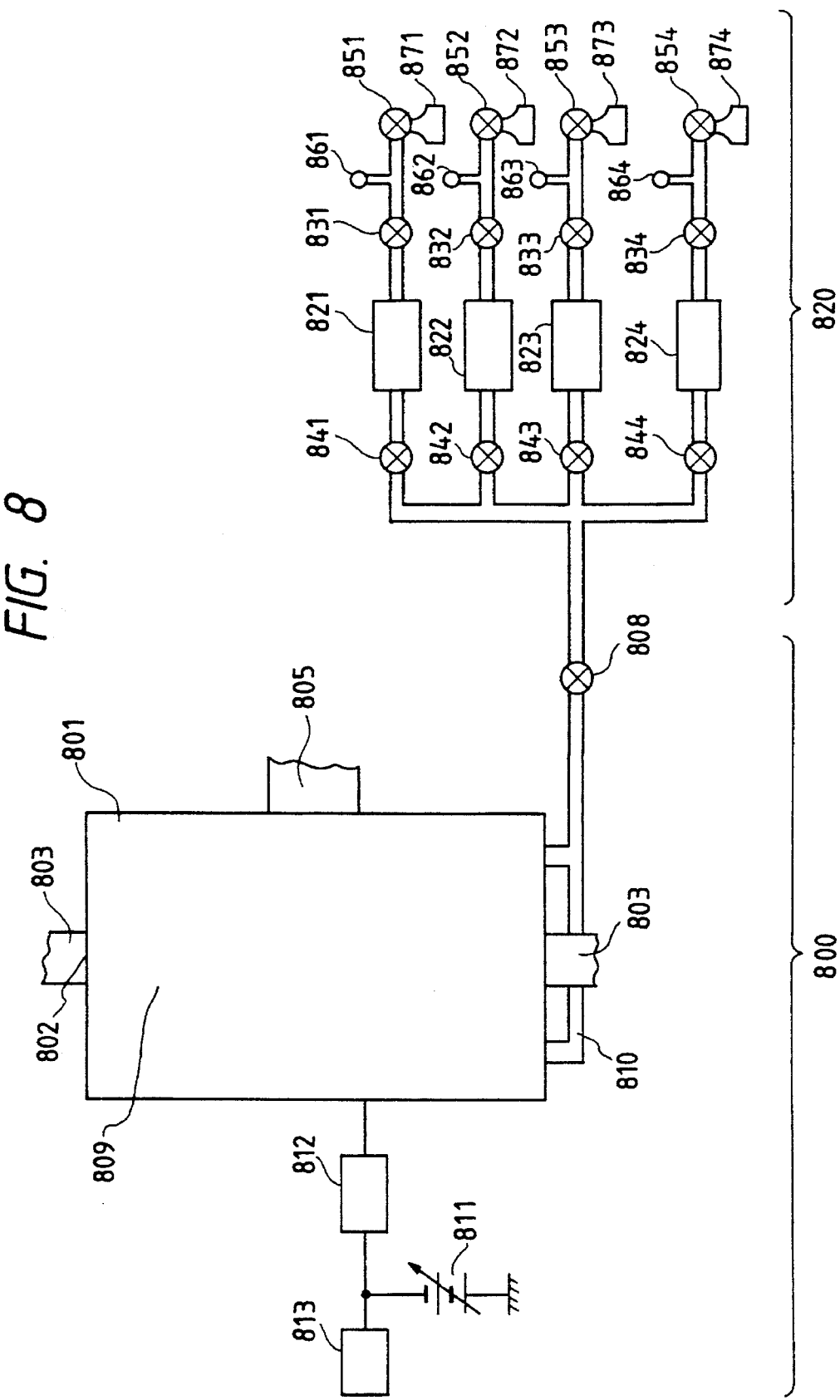
FIG. 8 illustrates schematically an apparatus for producing an electrophotographic light-receiving member employing non-monocrystalline silicon carbide semiconductors of the present invention and conventional ones according to microwave glow discharge.
Figure 9:
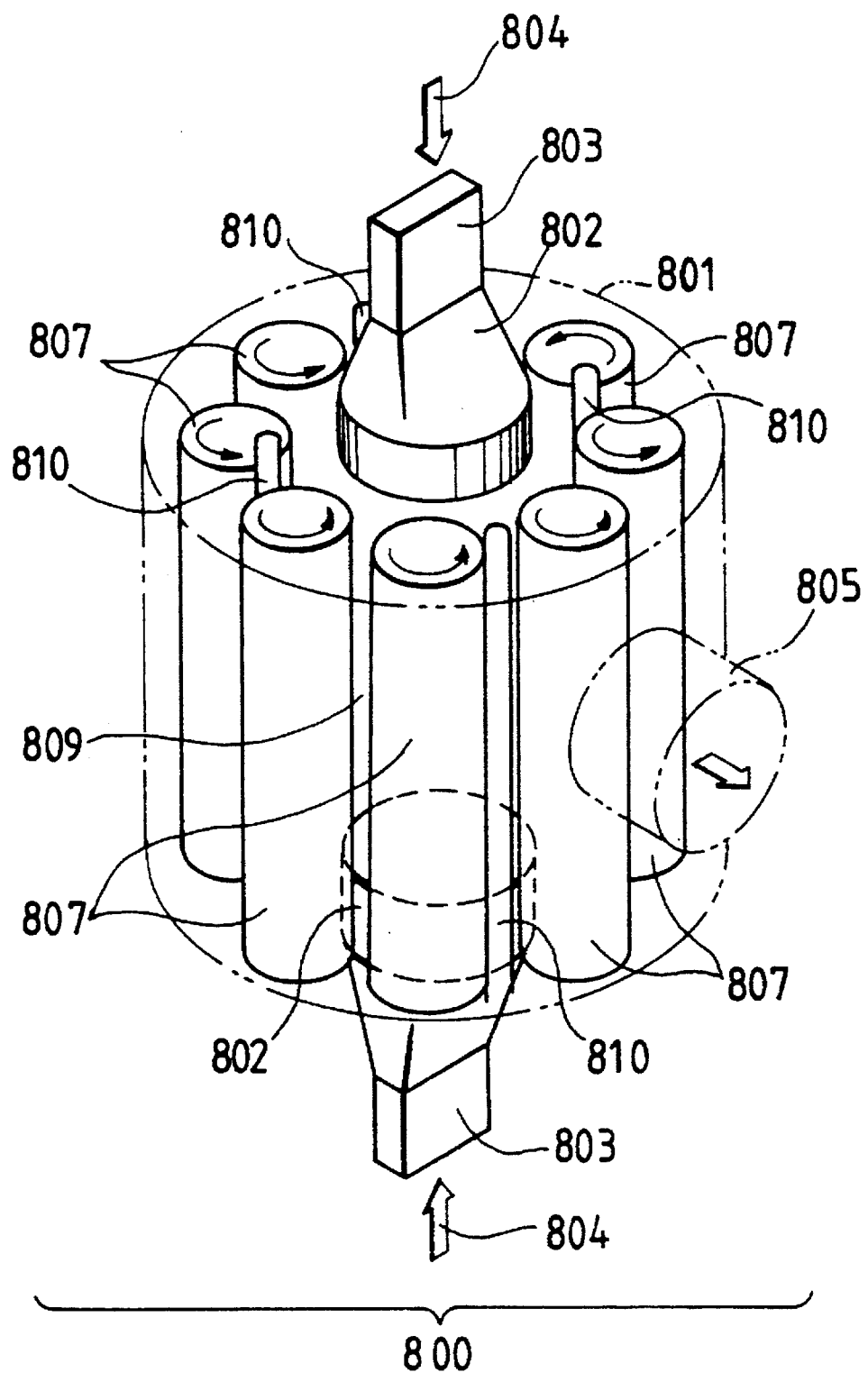
FIG. 9 is a schematic view of the film-forming apparatus 800 shown FIG. 8.

FIG. 8 and FIG. 9 illustrate a production apparatus for light-receiving members for electrophotography by microwave glow discharge decomposition, the apparatus being constituted of starting-gas-feeding apparatus 820 and a film-forming apparatus 800.

In the drawing, the gas cylinders 871–874 hold the starting gases for producing the electrophotographic light-receiving member of the present invention. The gas cylinder 871 holds SiH$_4$ gas (purity: 99.99%). The gas cylinder 872 holds D$_2$ gas (purity: 99.6%). The gas cylinder 873 holds B$_2$H$_6$ gas (purity: 99.999) diluted to 1% with H$_2$ gas (hereinafter referred to as "B$_2$H$_6$/H$_2$ (1%) gas"). The gas cylinder 874 holds CH$_4$ gas (purity: 99.999%). Preliminarily, in the same manner as in Example 1, the gases are respectively introduced into the gas pipelines at controlled pressures.

Firstly, the respective gases were introduced into the mass-flow controllers 821–824 in the same manner as in Experiment 1, thereby the apparatus being ready for film formation.

Then charge-injection-preventing layer and photoconductive layer were formed on a support to provide electrophotographic light-receiving member. The support is cylindrical and is made of aluminum, of 108 mm diameter, 358 mm long, and 5 mm thick, and are mirror-polished at the surface (not shown in the drawing).

The charge-injection-preventing layer was formed in a manner as described below. The support was heated to 300° C. with the heater not shown in the drawing. The feeding valves 841–843 and the auxiliary valve 808 were gradually opened to feed $SiH_4$ gas, $D_2$ gas, and $B_2H_6/H_2$ (1%) gas through gas-introducing holes (not shown in the drawing) of the gas-introducing pipes 810 into the plasma-generating space 809. The flow rate of $SiH_4$ gas was controlled to 200 SCCM, $D_2$ gas to 1000 SCCM, and $B_2H_6/H_2$ (1%) gas to 10 SCCM respectively by means of the mass flow controllers 821–823. The pressure in the film-forming chamber 801 was adjusted to 1 mTorr by controlling the opening of the conductance valve (not shown in the drawing) by reference to a vacuum gauge (not shown in the drawing).

Then, a DC bias of −120 V was applied to the film-forming chamber 801 by the DC source 811, and further a high-frequency power of 40 $mW/cm^3$ was applied to the support by the high frequency source 813 through the high-frequency matching box 812.

With a microwave power source (not shown in the drawing) set at the level of 800 $mW/cm^3$ a microwave power was introduced into the plasma-generating chamber 809 through a waveguide tube (not shown in the drawing), the waveguide portion 803, and the dielectric window 802 to generate microwave glow discharge therein, thereby starting the formation of a charge-injection-preventing layer on the support. At the time when the charge-injection-preventing layer had grown to have a thickness of 3 µm, the preparation of the charge-injection-preventing layer was finished by stopping the microwave glow discharge, cutting the power supplied from the DC source 811 and the high-frequency source 813, and closing the feeding valves 841–843 and the auxiliary valve 808 to stop the gas introduction to the film-forming chamber 801.

Next the photoconductive layer was formed in a manner as described below. The support was heated to 300° C. with the heater not shown in the drawing. The feeding valves 841, 842, and 844 were gradually opened to feed $SiH_4$ gas, $D_2$ gas, and $CH_4$ gas through gas-introducing holes (not shown in the drawing) of the gas-introducing pipes 810 into the plasma-generating space 809. The flow rate of $SiH_4$ gas was controlled to 200 SCCM, $D_2$ gas to 1500 SCCM, and $CH_4$ gas to 30 SCCM respectively by means of the mass flow controllers 821, 822, and 824. The pressure in the film-forming chamber 801 was adjusted to 2 mTorr by controlling the opening of the conductance valve (not shown in the drawing) by reference to a vacuum gauge (not shown in the drawing).

Then, a DC bias of −110 V was applied to the film-forming chamber 801 by the DC source 811, and further a high-frequency power of 40 $mW/cm^3$ was applied to the support by the high frequency source 813, through the high-frequency matching box 812.

Subsequently, with a microwave power source (not shown in the drawing) set at the level of 1000 $mW/cm^3$, a microwave power was introduced into the plasma-generating chamber 809 through a waveguide tube (not shown in the drawing), the waveguide portion 803, and the dielectric window 802 to generate microwave glow discharge therein, thereby starting the formation of a photoconductive layer on the charge-injection-preventing layer. At the time when the photoconductive layer had grown to have a layer thickness of 25 µm, the preparation of the photoconductive layer was finished by stopping the microwave glow discharge, cutting the power supplies from the DC source 811 and the high-frequency source 813, and closing the feeding valves 841, 842, and 844 and the auxiliary valve 808 to stop the gas introduction to the film-forming chamber 801. Thereby the formation of the photoconductive layer was completed.

Naturally, in the preparation of the respective layers, only the necessary valves of the feeding valves 841–844 were opened. To avoid the remaining of the respective gas in the film-forming chamber 801 and in the pipe lines from the feeding valves 841–844 to the film-forming chamber 801, the systems were evacuated once as desired to a high vacuum with the feeding-valves 841–844 closed, the auxiliary valve 808 opened, and the conductance valve (not shown in the drawing) fully opened.

The preparation conditions of the electrophotographic light-receiving member (Drum No. Ex. 4) are shown in Table 12.

Comparative Example 4

(Light-Receiving Member for

Electrophotography

A light-receiving member for electrophotography was prepared by employing a conventional non-monocrystalline silicon carbide semiconductor in the same manner and with the same apparatus as in Example 4 except that the $D_2$ gas cylinder was replaced by an $H_2$ gas cylinder (gas purity: 99.999%) under the conditions shown in Table 13 (Drum No. Comp. Ex. 4).

The electrophotographic light-receiving member (Drum Nos. Ex. 4, and Comp. Ex. 4) prepared in Example 4 and Comparative Example 4 were mounted on a copying machine NP-8580 (made by Canon K. K.) which had been modified for experiment, and thereby the chargeability, the sensitivity, the temperature characteristics, the optical memory, and the uniformity were evaluated in the manner shown below.

The chargeability was evaluated by measuring the dark portion potential under a fixed charging conditions.

The sensitivity was evaluated by adjusting the charging conditions so as to attain the same potential of the dark portion, and measuring the difference between the light-portion potential and the dark-portion potential.

The temperature characteristics were evaluated by measuring the rate of change of the dark-portion potential of the electrophotographic light-receiving member between the temperatures of 25° C. and 44° C.

The optical memory was evaluated by exposing a portion of the electrophotographic light-receiving member to light of 1500 lux emitted from a fluorescent light for 12 hours, copying a half tone image, and measuring the image density difference between the portion exposed to the fluorescent lamp light and the portion not exposed to light.

The uniformity was evaluated by variation of the image density of 100 points at the half tone image, each point being a circular area of 0.05 mm diameter.

As the results of the evaluation, the electrophotographic light-receiving member of the present invention (Drum No. Ex. 4) exhibited a chargeability larger by a factor of 1.25, a sensitivity higher by a factor of 1.2, a temperature characteristics (the rate of the change of a dark portion potential) smaller by a factor of 0.6, an optical memory (difference in image density) smaller by a factor of 0.5, and a uniformity (variation of image density) smaller by a factor of 0.45 than the conventional electrophotographic light-receiving member (Drum No. Comp. Ex. 4), being superior in all the evaluation items.

Further the copied image was evaluated visually by use of a test sheet NA-7 made by Canon K. K. The electrophotographic light-receiving member (Drum No. Ex. 4) of Example 4 of the present invention was found to give higher quality of images with less crushed line of images even in a fine letter; higher resolution with definite border between black potions and white portions; less non-uniformity and less fogging throughout the whole image in comparison with the conventional one of Comparative Example 4 (Drum No. Comp. 4). Furthermore, image evaluation was conducted by taking a photograph as the evaluation image, and it was found that half tone was reproduced satisfactorily, coarseness o the image is less, and the uniformity is satisfactory.

The samples for microvoid analysis were produced by forming a film of non-monocrystalline silicon carbide semiconductor on a high-purity aluminum foil of 5 mm square and 10 μm thick under the same conditions for the photoconductive layers of Example 4 and Comparative Example 4 (Photoconductive layer sample Nos. Ex. 4 and Comp. Ex. 4). The samples were subjected to the measurement of the average radius and the density of the microvoids by use of a small angle X-ray scattering apparatus in the same manner as Experiment 1. As the results, the non-monocrystalline silicon carbide semiconductor (Photoconductive layer sample No. Ex. 4) of Example 4 had microvoids of an average radius of 2.6 Å at a density of $7.2\times10^{18}$ cm$^{-3}$, while the non-monocrystalline silicon carbide semiconductor (Photoconductive layer sample No. Comp. Ex. 4) of Comparative Example 4 had microvoids of an average radius of 4.1 Å at a density of $1.9\times10^{19}$ cm$^{-3}$.

From the results of the evaluation, the electrophotographic light-receiving member employing the non-monocrystalline silicon carbide semiconductor of the present invention, which has microvoids of an average radius of not more than 3.5 Å at a density of not more than $1\times10^{19}$ cm$^{-3}$, was found to have excellent electrophotographic characteristics.

TABLE 1

(Preparation Conditions of Experiment 1)

| Sample No. | Gases Employed | Flow Rate (sccm) |
|---|---|---|
| Exp. 1-1 | $B_2H_6/H_2$ (10%) | 5 |
| Exp. 1-2 | $B_2H_6/H_2$ (10%) | 0.5 |
| Exp. 1-3 | $B_2H_6/H_2$ (10 ppm) | 25 |
| Exp. 1-4 | $B_2H_6/H_2$ (10 ppm) | 5 |
| Exp. 1-5 | None | None |
| Exp. 1-6 | $PH_3/H_2$ (10 ppm) | 5 |
| Exp. 1-7 | $PH_3/H_2$ (10 ppm) | 25 |
| Exp. 1-8 | $PH_3/H_2$ (10%) | 0.5 |
| Exp. 1-9 | $PH_3/H_2$ (10%) | 5 |

TABLE 2

(Preparation Conditions of Experiment 1)

| Substrate | SUS304 50 mm square Thickness: 1 mm Surface is planished and chromium is vapor deposited in a thickness of 0.1 μm. | | | | | | | |
|---|---|---|---|---|---|---|---|---|
| Non-monocrystalline Silicon Carbide Semiconductor | Gases Employed and Flow Rate (sccm) | | Microwave Power (mW/cm³) | Internal Pressure (mtorr) | Substrate Temp. (°C.) | DC Bias (V) | High Frequency Bias (mW/cm³) | Layer Thickness (μm) |
| | $SiH_4$ <br> $D_2$ <br> $CH_4$ <br> $PH_3/H_2$ (10%) <br> $B_2H_6/H_2$ (10%) <br> $PH_3/H_2$ (10 ppm) <br> $B_2H_6/H_2$ (10 ppm) | 5 <br> 100 <br> 1 <br> as set forth in TABLE 1 | 90 | 0.8 | 300 | −12.0 | 1.5 | 3 |
| Upper Electrode | Vapor deposited chromium of 2 mm in diameter and 0.1 μm in thickness | | | | | | | |

TABLE 3

(Preparation Conditions of Comparative Experiment 1)

| Sample No. | Gases Employed | Flow Rate (sccm) |
|---|---|---|
| Comp. 1-1 | $B_2H_6/H_2$ (10%) | 1 |
| Comp. 1-2 | $B_2H_6/H_2$ (10%) | 0.1 |
| Comp. 1-3 | $B_2H_6/H_2$ (10 ppm) | 5 |
| Comp. 1-4 | $B_2H_6/H_2$ (10 ppm) | 1 |
| Comp. 1-5 | None | None |
| Comp. 1-6 | $PH_3/H_2$ (10 ppm) | 1 |
| Comp. 1-7 | $PH_3/H_2$ (10 ppm) | 5 |
| Comp. 1-8 | $PH_3/H_2$ (10%) | 0.1 |
| Comp. 1-9 | $PH_3/H_2$ (10%) | 1 |

TABLE 4

(Preparation Conditions of Comparative Experiment 1)

| Substrate | SUS 304  50 mm square  Thickness: 1 mm<br>Surface is planished and chromium is vapor deposited in a thickness<br>of 0.1 μm. | | | | | |
|---|---|---|---|---|---|---|
| Non-monocrystalline<br>Silicon Carbide<br>Semiconductor | Gases Employed<br>and Flow Rate<br>(sccm) | | High Frequency<br>Power<br>(mW/cm$^3$) | Internal<br>Pressure<br>(torr) | Substrate<br>Temp.<br>(°C.) | Layer<br>Thickness<br>(μm) |
| | SiH$_4$<br>H$_2$<br>CH$_4$<br>PH$_3$/H$_2$ (10%)<br>B$_2$H$_6$/H$_2$ (10%)<br>PH$_3$/H$_2$ (10 ppm)<br>B$_2$H$_6$/H$_2$ (10 ppm) | 1<br>100<br>0.2<br>as set<br>forth in<br>TABLE 3 | 7 | 1 | 250 | 3 |
| Upper Electrode | Vapor deposited chromium of 2 mm in diameter and 0.1 μm in thickness | | | | | |

TABLE 5

(Preparation Conditions of Experiment 2)

| Substrate | | SUS304  50 mm square  Thickness: 1 mm<br>Surface is planished. | | | | | | | |
|---|---|---|---|---|---|---|---|---|---|
| Preparation Conditions of<br>Respective Layers | Layer<br>Name | Gases Employed<br>and Flow Rate<br>(sccm) | | Microwave<br>Power<br>(mW/cm$^3$) | Internal<br>Pressure<br>(mtorr) | Substrate<br>Temp.<br>(°C.) | DC Bias<br>(V) | High<br>Frequency<br>Bias<br>(mW/cm$^3$) | Layer<br>Thickness<br>(nm) |
| | p-type<br>Layer | SiH$_4$<br>D$_2$<br>CH$_4$<br>B$_2$H$_6$/H$_2$<br>(10%) | 5<br>100<br>1<br>5 | 90 | 0.8 | 300 | −120 | 1.5 | 10 |
| | i-type<br>Layer | SiH$_4$<br>D$_2$<br>CH$_4$ | 5<br>100<br>1 | 90 | 0.8 | 300 | −120 | 1.5 | 500 |
| | n-type<br>Layer | SiH$_4$<br>D$_2$<br>CH$_4$<br>PH$_3$/H$_2$<br>(10%) | 5<br>100<br>1<br>5 | 90 | 0.8 | 300 | −120 | 1.5 | 10 |
| Transparent<br>Conductive<br>Layer | Vapor deposited ITO of 6 mm in diameter and 70 nm in thickness | | | | | | | | |

TABLE 6

(Preparation Conditions of Comparative Experiment 2)

| Substrate | | SUS304  50 mm square  Thickness: 1 mm<br>Surface is planished. | | | | | |
|---|---|---|---|---|---|---|---|
| Preparation Conditions of<br>Respective Layers | Layer<br>Name | Gases Employed<br>and Flow Rate<br>(sccm) | | High Frequency<br>Power<br>(mW/cm$^3$) | Internal<br>Pressure<br>(mtorr) | Substrate<br>Temp.<br>(°C.) | Layer<br>Thickness<br>(nm) |
| | p-type<br>Layer | SiH$_4$<br>H$_2$<br>CH$_4$<br>B$_2$H$_6$/H$_2$<br>(10%) | 1<br>100<br>0.2<br>1 | 7 | 1 | 250 | 10 |
| | i-type<br>Layer | SiH$_4$<br>H$_2$<br>CH$_4$ | 1<br>100<br>0.2 | 7 | 1 | 250 | 500 |
| | n-type<br>Layer | SiH$_4$<br>H$_2$<br>CH$_4$<br>PH$_3$/H$_2$ | 1<br>100<br>0.2<br>1 | 7 | 1 | 250 | 10 |

TABLE 6-continued (Preparation Conditions of Comparative Experiment 2)

| | |
|---|---|
| | (10%) |
| Transparent Conductive Layer | Vapor deposited ITO of 6 mm in diameter and 70 nm in thickness |

TABLE 7

(Preparation Conditions of Experiment 5)

| Sample No. | Gases Employed and Flow Rate (sccm) | |
|---|---|---|
| Exp. 5-1 | D$_2$ | 2.5 |
| Exp. 5-2 | D$_2$ | 50 |
| Exp. 5-3 | D$_2$ | 500 |
| Comp. 5 | H$_2$ | 50 |

TABLE 8

(Preparation Conditions of Experiment 5)

| Substrate | Aluminium Foil with High Purity 5 mm square Thickness: 10 μm |
|---|---|
| | Stainless 5 mm square Thickness: 1 mm |

| Non-monocrystalline Silicon Carbide Semiconductor | Gases Employed and Flow Rate (sccm) | | Microwave Power (mW/cm$^3$) | Internal Pressure (mtorr) | Substrate Temp. (°C.) | DC Bias (V) | High Frequency Bias (mW/cm$^3$) | Layer Thickness (μm) |
|---|---|---|---|---|---|---|---|---|
| | SiH$_4$ | 5 | 75 | 1 | 300 | −150 | 2 | 3 |
| | D$_2$ | as set forth in TABLE 7 | | | | | | |
| | H$_2$ | | | | | | | |
| | CH$_4$ | 1 | | | | | | |

TABLE 9

(Preparation Conditions of Experiment 5)

| Substrate | | SUS304 50 mm square Thickness: 1 mm Surface is planished. | | | | | | | |
|---|---|---|---|---|---|---|---|---|---|
| Preparation Conditions of Respective Layers | Layer Name | Gases Employed and Flow Rate (sccm) | | Microwave Power (mW/cm$^3$) | Internal Pressure (mtorr) | Substrate Temp. (°C.) | DC Bias (V) | High Frequency Bias (mW/cm$^3$) | Layer Thickness (nm) |
| | p-type Layer | SiH$_4$ | 5 | 90 | 0.8 | 300 | −120 | 1.5 | 5 |
| | | D$_2$ | 100 | | | | | | |
| | | CH$_4$ | 1 | | | | | | |
| | | B$_2$H$_6$/H$_2$ (10%) | 5 | | | | | | |
| | i-type Layer | SiH$_4$ | 5 | 75 | 1 | 300 | −150 | 2 | 500 |
| | | D$_2$ | as set forth in TABLE 7 | | | | | | |
| | | H$_2$ | | | | | | | |
| | | CH$_4$ | 1 | | | | | | |
| | n-type Layer | SiH$_4$ | 5 | 90 | 0.8 | 300 | −120 | 1.5 | 5 |
| | | D$_2$ | 100 | | | | | | |
| | | CH$_4$ | 1 | | | | | | |
| | | PH$_3$/H$_2$ (10%) | 5 | | | | | | |
| Transparent Conductive Layer | | Vapor deposited ITO of 6 mm in diameter and 70 nm in thickness | | | | | | | |

TABLE 10

(Preparation Conditions of Example 1)

| Preparation Conditions of Respective Layers | Layer Name | Gases Employed and Flow Rate (sccm) | | Microwave Power (mW/cm$^3$) | Internal Pressure (mtorr) | Substrate Temp. (°C.) | DC Bias (V) | High Frequency Bias (mW/cm$^3$) | Layer Thickness (nm) |
|---|---|---|---|---|---|---|---|---|---|
| | n-type Layer | SiH$_4$<br>D$_2$<br>PH$_3$/H$_2$ (10%) | 5<br>100<br>5 | 70 | 2 | 400 | −100 | 1 | 10 |
| | i-type Layer | SiH$_4$<br>D$_2$<br>CH$_4$ | 5<br>100<br>1 | 90 | 0.8 | 300 | −120 | 1.5 | 400 |
| | p-type Layer | SiH$_4$<br>D$_2$<br>B$_2$H$_6$/H$_2$ (10%) | 5<br>100<br>5 | 70 | 2 | 400 | −100 | 1 | 10 |

TABLE 11

(Preparation Conditions of Comparative Example 1)

| Preparation Conditions of Respective Layers | Layer Name | Gases Employed and Flow Rate (sccm) | | High Frequency Power (mW/cm$^3$) | Internal Pressure (torr) | Substrate Temp. (°C.) | Layer Thickness (nm) |
|---|---|---|---|---|---|---|---|
| | n-type Layer | SiH$_4$<br>H$_2$<br>PH$_3$/H$_2$ (10%) | 1<br>50<br>1 | 5 | 1 | 250 | 10 |
| | i-type Layer | SiH$_4$<br>H$_2$<br>CH$_4$ | 1<br>100<br>0.2 | 7 | 1 | 250 | 400 |
| | p-type Layer | SiH$_4$<br>H$_2$<br>B$_2$H$_6$/H$_2$ (10%) | 1<br>50<br>1 | 5 | 1 | 250 | 10 |

TABLE 12

(Preparation Conditions of Example 4)

| Substrate | Aluminium of 108 mm in diameter, 358 mm in length and 5 mm in thickness<br>Surface is planished. | | | | | | | | |
|---|---|---|---|---|---|---|---|---|---|
| Preparation Conditions of Respective Layers | Layer Name | Gases Employed and Flow Rate (sccm) | | Microwave Power (mW/cm$^3$) | Internal Pressure (mtorr) | Substrate Temp. (°C.) | DC Bias (V) | High Frequency Bias (mW/cm$^3$) | Layer Thickness (μm) |
| | Charge Injection Preventing Layer | SiH$_4$<br>D$_2$<br>B$_2$H$_6$/H$_2$ (1%) | 200<br>1000<br>10 | 800 | 1 | 300 | −120 | 40 | 3 |
| | Photo-conductive Layer | SiH$_4$<br>D$_2$<br>CH$_4$ | 200<br>1500<br>30 | 1000 | 2 | 300 | −110 | 40 | 25 |

TABLE 13

(Preparation Conditions of Comparative Example 4)

| Substrate | Aluminium of 108 mm in diameter, 358 mm in length and 5 mm in thickness Surface is planished. | | | | | | | |
|---|---|---|---|---|---|---|---|---|
| Preparation Conditions of Respective Layers | Layer Name | Gases Employed and Flow Rate (sccm) | | Microwave Power (mW/cm$^3$) | Internal Pressure (mtorr) | Substrate Temp. (°C.) | DC Bias (V) | High Frequency Bias (mW/cm$^3$) | Layer Thickness (μm) |
| | Charge Injection Preventing Layer | SiH$_4$ H$_2$ B$_2$H$_6$/H$_2$ (1%) | 200 1000 10 | 100 | 5 | 300 | −80 | 0 | 3 |
| | Photo- conductive Layer | SiH$_4$ H$_2$ CH$_4$ | 200 1000 30 | 150 | 5 | 300 | −100 | 0 | 25 |

What is claimed is:

1. A non-monocrystalline silicon carbide semiconductor comprising carbon atoms, silicon atoms, and at least one of hydrogen atoms and halogen atoms, the non-monocrystalline silicon carbide semiconductor having therein microvoids with an average radius of not more than 3.5 Å at a microvoid density of not more than $1 \times 10^{19}$ cm$^{-3}$.

2. The non-monocrystalline silicon carbide semiconductor of claim 1, further comprising therein at least one of a Group IIIb element selected from the group consisting B, Al, Ga, In and Tl and a Group Vb element selected from the group consisting P, As, Sb and Bi.

3. The non-monocrystalline silicon carbide semiconductor according to claim 1, wherein the non-monocrystalline silicon carbide semiconductor is an amorphous semiconductor.

4. The non-monocrystalline silicon carbide semiconductor according to claim 3, wherein the content of the hydrogen atoms is 1–30 atomic %.

5. The non-monocrystalline silicon carbide semiconductor according to claim 3, wherein the ratio of (C—H$_3$)/(C—H) is not more than ⅕ and the ratio of (Si—H$_2$)/(Si—H) is not more than 1/20.

6. The non-monocrystalline silicon carbide semiconductor according to claim 1, wherein the content of the halogen atoms is 0.1–10 atomic %.

7. The non-monocrystalline silicon carbide semiconductor according to claim 1, wherein the non-monocrystalline silicon carbide semiconductor is a polycrystalline semiconductor.

8. The non-monocrystalline silicon carbide semiconductor according to claim 7, wherein the content of the hydrogen atoms is 0.1–10 atomic %.

9. The non-monocrystalline silicon carbide semiconductor according to claim 7, wherein the ration of (C—H$_3$)/(C—H) is not more than ⅓ and the ratio of (Si—H$_2$)/(Si—H) is not more than 1/10.

10. A semiconductor device, comprising a non-monocrystalline silicon carbide semiconductor comprising carbon atoms, silicon atoms, and at least one of hydrogen atoms and halogen atoms, the non-monocrystalline silicon carbide semiconductor having therein microvoids with an average radius of not more than 3.5 Å at a microvoid density of not more-than $1 \times 10^{19}$ cm$^{-3}$.

11. An electrophotographic apparatus comprising the semiconductor device according to claim 10.

12. A solar cell comprising the semiconductor device according to claim 10.

13. The semiconductor device according to claim 10, wherein the non-monocrystalline silicon carbide semiconductor is a thin film transistor.

14. The semiconductor device according to claim 10, wherein the non-monocrystalline silicon carbide semiconductor is a photosensor.

* * * * *

UNITED STATES PATENT AND TRADEMARK OFFICE
CERTIFICATE OF CORRECTION

PATENT NO. : 5,510,631

DATED : April 23, 1996

INVENTORS : KEISHI SAITO ET AL.          Page 1 of 10

It is certified that error appears in the above-identified patent and that said Letters Patent is hereby corrected as shown below:

COLOUM 1

Line 27, "to to" should read --to--;
Line 48, "2859)" should read --2859).--.

COLUMN 2

Line 27, "A-still" should read --A still--.

COLUMN 3

Line 56, "$2 \times 10^{11} (cm^{-1})$." should read --$2 \times 10^{11} (cm^{-2})$.--.

COLUMN 6

Line 18, "later" should read --layer--;
Line 30, "contributes" should read --contribute--.

UNITED STATES PATENT AND TRADEMARK OFFICE
CERTIFICATE OF CORRECTION

PATENT NO. : 5,510,631

DATED : April 23, 1996

INVENTORS : KEISHI SAITO ET AL.

It is certified that error appears in the above-identified patent and that said Letters Patent is hereby corrected as shown below:

COLUMN 7

Line 2,     "loners" should read --lowers--;
   Line 6,     "non.-monocrystalline: should read --non-monocrystalline--;
   Line 21,    "constituted" should read --constituted of--.

COLUMN 8

Line 17,    "butent-1" should read --butene-1--;
   Line 18,    "butane-2" should read --butene-2-- and "$(C_5M_{10})$ should read $(C_5M_{10})$;--;
   Line 30,    "an" should read --and--;
   Line 42,    "halogen-atom.-containing" should read --halogen-atom-containing--;
   Line 46,    "o" should read --to--;
   Line 53,    "halogan-substituted" should read --halogen-substituted-- and hydride" should read --hydrides--.

UNITED STATES PATENT AND TRADEMARK OFFICE
CERTIFICATE OF CORRECTION

PATENT NO. : 5,510,631

DATED : April 23, 1996

INVENTORS : KEISHI SAITO ET AL.

It is certified that error appears in the above-identified patent and that said Letters Patent is hereby corrected as shown below:

COLUMN 9

| | |
|---|---|
| Line 3, | "atom" should read --atoms--; |
| Line 7, | "hydride" should read --hydrides--; |
| Line 17, | "has" should read --has an--; |
| Line 22, | "1.00" should read --100--; |
| Line 38, | "excites" should read --excite--; |
| Line 40, | "is" should read --are--; |
| Line 46, | "is" should read --are--. |

COLUMN 10

| | |
|---|---|
| Line 4, | "sterting" should read --starting--; |
| Line 7, | "end" should read --and--; |
| Line 14, | "end" should read --and--; |
| Line 18, | "gase" should read --gases--; |
| Line 24, | "ductor." should read --ductor--; |
| Line 36, | "range" should read --the range--; |
| Line 55, | "invention" should read --invention.--; |
| Line 57, | "dueterum" should read --deuterium--; |

UNITED STATES PATENT AND TRADEMARK OFFICE
CERTIFICATE OF CORRECTION

PATENT NO. : 5,510,631
DATED : April 23, 1996
INVENTORS : KEISHI SAITO ET AL.

It is certified that error appears in the above-identified patent and that said Letters Patent is hereby corrected as shown below:

Line 61,    "refered" should read --referred--.

COLUMN 11

Line 66,    "iliary." should read --iliary--.

COLUMN 12

Line 26,    "Gas" should read --gas--;

Line 58,    "1 Tort" should read --1 Torr--.

COLUMN 13

Line 22,    "electrode" should read --electrodes--;
    Line 34,    "approximtely" should read --approximately--;
    Line 51,    "Experiment" should read --Experiment 1--.

UNITED STATES PATENT AND TRADEMARK OFFICE
CERTIFICATE OF CORRECTION

PATENT NO. : 5,510,631

DATED : April 23, 1996

INVENTORS : KEISHI SAITO ET AL.

It is certified that error appears in the above-identified patent and that said Letters Patent is hereby corrected as shown below:

COLUMN 14

Line 7, "is" should read --are--.

COLUMN 15

Line 6, "mW/cm³" should read --mW/cm³, and--;
Line 17, "non-monocrystaliine" should read
--non-monocrystalline--;
Line 36, "prepartion" should read --preparation--;
Line 46, "s" should read --a--;
Line 51, "conditions" should read --conditions of--;
Line 61, "conditions" should read --conditions of--;
Line 65, "n-type" should read --the n-type--.

COLUMN 16

Line 4, "1 Tort" should read --1 Torr--;
Line 22, "2)," should read --2).--.

UNITED STATES PATENT AND TRADEMARK OFFICE
CERTIFICATE OF CORRECTION

PATENT NO. : 5,510,631

DATED : April 23, 1996

INVENTORS : KEISHI SAITO ET AL.

It is certified that error appears in the above-identified patent and that said Letters Patent is hereby corrected as shown below:

COLUMN 17

Line 25,   "an" should read --and--;
   Line 31,   "the the" should read --the --.

COLUMN 18

Line 3,    "were" should be deleted;
   Line 4,    "prepared" should be deleted;
   Line 11,   "a" should be deleted;
   Line 14,   "$H_2$gas" should read --$H_2$ gas--;
   Line 33,   "element" should read --elements--;
   Line 54,   "were" should read --was--;
   Line 55,   "reflective" should read --a reflective--.

COLUMN 19

Line 24,   "thereafter." should read --thereafter--;
   Line 51,   "the the" should read --in the--;
   Line 53,   "evaluate" should read --evaluated--;
   Line 55,   "Example" should read --Example 2--;
   Line 56,   "b" should read --by--;

UNITED STATES PATENT AND TRADEMARK OFFICE
CERTIFICATE OF CORRECTION

PATENT NO. : 5,510,631

DATED : April 23, 1996

INVENTORS : KEISHI SAITO ET AL.

It is certified that error appears in the above-identified patent and that said Letters Patent is hereby corrected as shown below:

Line 58,    "support" should read --support and--.

COLUMN 20

Line 14,    "i-type" should read --the i-type--;
    Line 31,    "NO." should read --No.--;
    Line 35,    "Gate" should read --gate--;
    Line 64,    "99.999)" should read --99.999%)--.

COLUMN 21

Line 7,     "and." should read --and--;
    Line 33,    "800 mW/cm$^3$" should read --800 mW/cm$^3$,--.

UNITED STATES PATENT AND TRADEMARK OFFICE
CERTIFICATE OF CORRECTION

PATENT NO. : 5,510,631

DATED : April 23, 1996

INVENTORS : KEISHI SAITO

It is certified that error appears in the above-identified patent and that said Letters Patent is hereby corrected as shown below:

COLUMN 22

```
Line 7,    "Grown" should read --grown--;
Line 9,    "Glow" should read --glow--;
Line 29,   "For" should read --For Electrophotography)--;
Line 31,   "Electrophotography" should be deleted.
Line 38,   "99.999%)" should read --99.9999%)--;
Line 49,   "a" should be deleted.
```

COLUMN 23

```
Line 1,    "the;" should read --the--;
Line 5,    "teristics" should read --teristic--;
Line 8,    "mam-" should read --mem--;
Line 17,   "potions" should read --portions--;
Line 23,   "o" should read --of--.
```

COLUMN 27

```
Table 8, "Aluminium" should read --Aluminum--.
```

UNITED STATES PATENT AND TRADEMARK OFFICE
CERTIFICATE OF CORRECTION

PATENT NO. : 5,510,631

DATED : April 23, 1996

INVENTORS : KEISHI SAITO ET AL.

It is certified that error appears in the above-identified patent and that said Letters Patent is hereby corrected as shown below:

COLUMN 29

Table 12, "Aluminium" should read --Aluminum--.

COLUMN 31

Table 13, "Aluminium" should read --Aluminum--.

COLUMN 31

Line 27, "consisting" should read --consisting of--;
Line 29, "consisting" should read --consisting of--.

UNITED STATES PATENT AND TRADEMARK OFFICE
CERTIFICATE OF CORRECTION

PATENT NO. : 5,510631

DATED : April 23, 1996

INVENTORS : KEISHI SAITO ET AL.

Page 10 of 10

It is certified that error appears in the above-identified patent and that said Letters Patent is hereby corrected as shown below:

COLUMN 32

Line 24, "ration" should read --ratio--;
Line 33, "more-than" should read --more than--.

Signed and Sealed this

Twenty-sixth Day of November 1996

Attest:

BRUCE LEHMAN

Attesting Officer

Commissioner of Patents and Trademarks